(12) United States Patent
Brandow et al.

(10) Patent No.: US 6,436,615 B1
(45) Date of Patent: Aug. 20, 2002

(54) METHODS AND MATERIALS FOR SELECTIVE MODIFICATION OF PHOTOPATTERNED POLYMER FILMS

(75) Inventors: Susan L. Brandow, Springdale, MD (US); Jeffrey M. Calvert, Alexandria, VA (US); Walter M. Dressick, Fort Washington, MD (US); Charles S. Dulcey, Washington, DC (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 09/339,917

(22) Filed: Jun. 25, 1999

(51) Int. Cl.[7] ................................................. G03F 7/00
(52) U.S. Cl. ....................... 430/324; 430/296; 430/325; 427/304
(58) Field of Search ................................ 430/324, 322, 430/325, 296; 427/304, 305, 437

(56) References Cited

U.S. PATENT DOCUMENTS

| | | | |
|---|---|---|---|
| 5,079,600 A |  | 1/1992 | Schnur et al. |
| 5,183,552 A |  | 2/1993 | Bressel et al. |
| 5,255,067 A | * | 10/1993 | Carrabba et al. |
| 5,342,737 A | * | 8/1994 | Georger, Jr. et al. |
| 5,378,502 A | * | 1/1995 | Willard et al. |
| 5,389,496 A | * | 2/1995 | Calvert et al. |
| 5,445,920 A | * | 8/1995 | Saito |
| 5,468,597 A | * | 11/1995 | Calabrese et al. |
| 5,500,315 A | * | 3/1996 | Calvert et al. |
| 5,597,471 A | * | 1/1997 | Ragge et al. |
| 5,648,201 A | * | 7/1997 | Dulcey et al. |
| 5,696,207 A |  | 12/1997 | Vargo et al. |
| 5,783,650 A | * | 7/1998 | Bowers et al. |
| 5,989,787 A | * | 11/1999 | Kanoh et al. |
| 6,048,667 A | * | 4/2000 | Eldin et al. |

OTHER PUBLICATIONS

C.S. Dulcey et al., Deep UV Photochemistry of Chemisorbed Monolayers: Patterned Coplanar Molecular Assemblies, Science, vol. 252, pp. 551–554, 1991.

W.J. Dressick et al., Patterning of Self–Assembled Films Using Lithographic Exposure Tools, Jpn. J. Appl. Phys., vol. 32, pp. 5829–5839, 1993.

W.J. Dressick et al., Covalent Binding of Pd Catalysts to Ligating Self–Assembled Monolayer Films for Selective Electroless Metal Deposition, J. Electrochem. Soc., vol. 141, pp. 210–220, 1994.

S.L. Brandow et al., Fabrication of Patterned Amine Reactivity Templates Using 4–Chloromethylphenylsiloxane Self–Assembled Monolayer Films, Langmuir, The ACS Journal of Surfaces and Colloids, vol. 15, No. 16, pp. 5429–5432, 1999.

W.J. Dressick et al., Patterned Noncovalent Binding and Metallization of Adsorbates in Thin Film Nanocavities, J. of the ACS, vol. 122, No. 5, pp. 982–983, 2000.

W..J. Dressick et al., Fabr.of Patt'd Surf. React. Templ. Using Physisorption of React. Spec. in Solv.–imprinted Nanocavities, pres. Microelectronics Conference, Santa Clara, CA, Feb. 28–Mar. 2, 2001, accepted to be publ. in Proc. of SPIE, vol. 4343, due out Fall, 2001.

W.J. Dressick et al., Imag. Lay. for 50 kV e–beam lith.: Sel. displ. on noncovalently bound amine ligands from siloxane host film, Appl. Phys. L., vol. 78,No. 5,Jan. 29, 2001, pp. 676–678.

* cited by examiner

*Primary Examiner*—Kathleen Duda
(74) *Attorney, Agent, or Firm*—John J. Karasek; Stephen T. Hunnius

(57) ABSTRACT

An aspect of the present invention is a process for modifying a substrate in areas that are exposed to actinic radiation, having the steps: (a) providing on the substrate functional groups adapted for conversion to oxygen-containing photoproducts upon exposure to actinic radiation; (b) exposing at least a portion of the substrate to the actinic radiation, converting the functional groups in an exposed region of the substrate to the photoproducts; (c) contacting the photoproducts with a primary or secondary amine in the presence of hydrogen ions, forming imine groups; and (d) contacting the imine groups with a reducing agent, forming amine groups on the substrate in the exposed region. Another aspect of the present invention is a process for modifying a substrate in areas that are unexposed to actinic radiation, having the steps: (a) providing on the substrate aryl functional groups adapted for conversion to oxygen-containing photoproducts upon exposure to actinic radiation; (b) exposing a portion of the substrate to the actinic radiation, converting the aryl functional groups in an exposed region of the substrate to the photoproducts, and not converting the aryl functional groups in an unexposed region of the substrate to the photoproducts; (c) contacting the aryl functional groups in the unexposed region of the substrate with a compound adapted for physisorption to the aryl functional groups, preferentially physisorbing the compound onto the substrate in the unexposed regions.

48 Claims, 5 Drawing Sheets ns and materials for selective modification of photopatterned polymer films

BACKGROUND OF THE INVENTION

1. Field of the Invention

The present invention relates generally to materials and methods for rapid and efficient preferential binding of chemical functional groups to surface reactivity templates (see below) formed by patterned irradiation of polymer films. In particular, the invention describes binding materials and processes which (i) can be carried out using safe solvents (e.g., water and simple aliphatic alcohols having 3 or fewer carbon atoms), (ii) are applicable to surfaces of polymer films of average thickness greater than one monolayer (i.e., thicknesses greater than ~0.5 nm), (iii) include either covalent or non-covalent (e.g., electrostatic, van der Waals, etc.) modes for binding the desired functional group (s) to the selected portion of the reactivity template formed on the polymer film surface, and (iv) permits preferential binding of the desired functional group to either the reactivity template created at the polymer film surface as a result of exposure of the film to patterned actinic radiation (thereby ultimately creating a negative tone image of the attached functional group) or that region of the polymer film left unexposed and unchanged during the aforementioned patterning process (thereby ultimately creating a positive tone image on the polymer surface).

2. Description of the Related Art

During the last several years, there has been an interest in exploring, developing, and continually refining the concept of surface reactivity templates. A reactivity template is a well-defined region of controlled dimensions and placement on a substrate surface where the chemical and/or physical properties of the region differ from the properties found elsewhere on the surface. One general scheme for the fabrication of reactivity templates is illustrated using organosilane thin films in FIG. 1. A substrate whose surface has at least some hydroxyl groups is treated with a solution of an organosilane of general formula $R_nR'_mSiX_{(4-n-m)}$ (where X is a halide or pseudohalide, R and R' are organic functional groups with n, m integers $\geq 0$ such that $1 \leq (n+m) \leq 3$; cases most often encountered are those for which n=1, m=0 (shown in FIG. 1) or n=1, m=2, R'=CH$_3$). For substrates which do not intrinsically possess surface hydroxyl groups, chemical or plasma treatments may generate the requisite surface —OH sites prior to the organosilane treatment. Chemisorption of the organosilane species onto the substrate surface occurs via reaction between the Si—X bond and surface —OH group; elimination of HX occurs with the formation of a strong Si—O— Substrate covalent bond. Following reaction with the organosilane, the chemical and physical properties of the surface reflect those of the homogeneous organosilane film covering, rather than those of the original substrate surface.

SUMMARY OF THE INVENTION

Accordingly, it is an object of this invention to provide improved substrate patterning, using environmentally friendlier materials than had been available using the techniques of the prior art.

The objects of the invention are accomplished by the structures and processes hereinafter described.

An aspect of the present invention is a process for modifying a substrate in areas that are exposed to actinic radiation, having the steps: (a) providing on the substrate functional groups adapted for conversion to oxygen-containing photoproducts upon exposure to actinic radiation; (b) exposing at least a portion of the substrate to the actinic radiation, converting the functional groups in an exposed region of the substrate to the photoproducts; (c) contacting the photoproducts with a primary or secondary amine in the presence of hydrogen ions, forming imine groups; and (d) contacting the imine groups with a reducing agent, forming amine groups on the substrate in the exposed region.

Another aspect of the present invention is a process for modifying a substrate in areas that are unexposed to actinic radiation, having the steps: (a) providing on the substrate aryl functional groups adapted for conversion to oxygen-containing photoproducts upon exposure to actinic radiation; (b) exposing a portion of the substrate to the actinic radiation, converting the aryl functional groups in an exposed region of the substrate to the photoproducts, and not converting the aryl functional groups in an unexposed region of the substrate to the photoproducts; (c) contacting the aryl functional groups in the unexposed region of the substrate with a compound adapted for physisorption to the aryl functional groups, preferentially physisorbing the compound onto the substrate in the unexposed regions.

BRIEF DESCRIPTION OF THE DRAWINGS

A more complete appreciation of the invention will be readily obtained by reference to the following Detailed Description of the Preferred Embodiments and the accompanying drawings in which like numerals in different figures represent the same structures or elements, wherein.

DETAILED DESCRIPTION OF THE PREFERRED EMBODIMENTS

Figure 1:
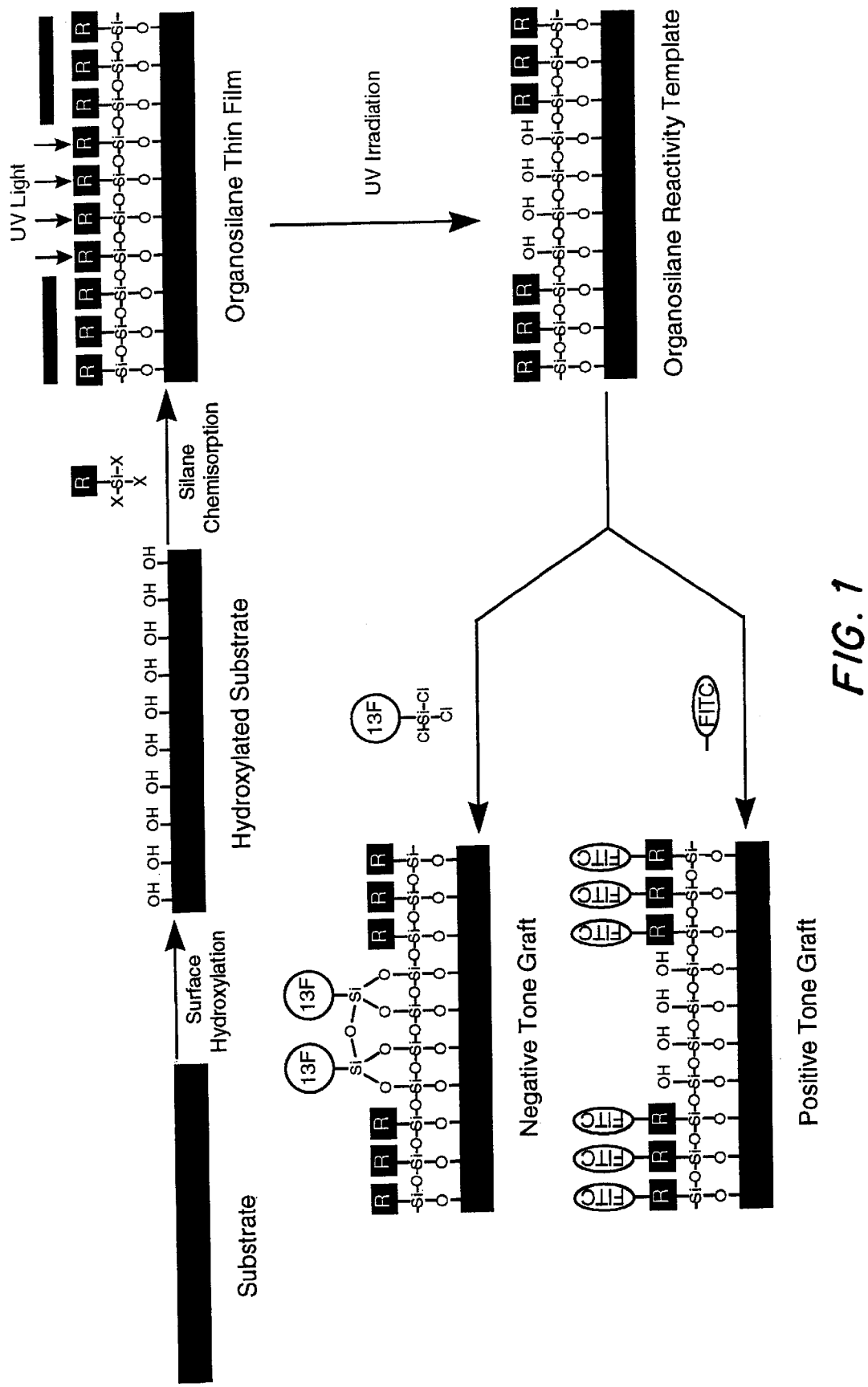
FIG. 1 shows a general reactivity template fabrication and grafting scheme.

Dulcey et al., Efficient Chemistry for Selective Modification and Metallization of Substrates, U.S. Pat. No. 5,648, 201, issued Jul. 15, 1997, is incorporated by reference herein, in its entirety, for all purposes.

This invention includes materials and procedures for preferential grafting of species possessing appropriate chemical functional groups for performing subsequent surface chemistries to specific sites defined by reactivity templates formed on a substrate surface. The following definitions of the terms "reactivity template" and "preferential grafting" apply herein. A "reactivity template" is an area of specified shape and dimensions located at a fixed, known position on the surface of a substrate. It is formed via selective modification of either the substrate surface or a thin film forming a homogeneous coating on the substrate surface. Often the selective modification process is a chemical reaction carried out by irradiation of the substrate surface through a mask on which a pattern defining the desired reactivity template has been formed. Irradiations are generally carried out using UV light (W. J. Dressick and J. M. Calvert, *Jpn. J. Appl. Phys.*, 32,5829 (1993), and references therein), ion beam (E. T. Ada, L. Hanley, S. Etchin, J.

Melngailis, W. J. Dressick, M-S. Chen and J. M. Calvert, *J. Vac. Sci. Tech.*, B13, 2189 (1995)) soft x-ray (J. M. Calvert, in *Organic Thin Films and Surfaces* Vol. 1, A. Ulman, Ed., Academic Press, Inc. (New York, 1994)) or related exposure tools. Reactivity templates have also been fabricated without masking using direct write exposure tools such as low voltage electron beams (F. K. Perkins, E. A. Dobisz, S. L. Brandow, J. M. Calvert, J. E. Kosakowski and C. R. K. Marrian *Appl. Phys. Lett.*, 68, 550 (1996), and references therein) and the conducting atomic force microscope (AFM) (S. L. Brandow, E. S. Snow, P. M. Campbell and J. M. Calvert, *J. Vac. Sci. Tech. A,* 15(3), 1455 (1997)). Surface modification need not be carried out using sources of electromagnetic energy. For example, a method has been recently described for fabrication of reactivity templates in which a Pt/Rh tip from a scanning tunneling microscope (STM) operated in a hydrogen atmosphere preferentially catalyzes hydrogenation of selected regions of carbonaceous thin films on metal substrates (B. J. McIntyre, M. Salmeron and G. A. Somorjai *Science,* 265, 1455 (1994)). Templates have also been created on protein coated substrates by flowing 500 nm diameter silica particles surface modified with chymotrypsin enzyme through channels created by contacting the substrate with a flexible, patterned polymer mask; biochemical hydrolysis of protein by the enzyme occurred only within the confines of the channels (D. Turner, M. Testoff and B. Gaber, *Proc. SPIE,* 2978, 22 (1997)). Regardless of the tool used to fabricate the template, functional groups in the exposed areas of the substrate surface must be altered such that they exhibit differing chemical or physical properties from the original functional groups remaining in the unexposed areas.

The term "preferential grafting" refers to the process of attaching an independent species to the region of the reactivity template containing either those new functional groups created by the exposure process or the original functional groups unexposed during template fabrication.

The species selected for attachment possesses a combination of physical and chemical properties which facilitates both attachment and subsequent participation in further technologically useful physical or chemical processes. For example, covalent reaction of an antibody's free cysteine sulfhydryl residue with a surface bound thiol group immobilizes the antibody on the substrate surface via a disulfide bond; the surface-tethered antibody is subsequently capable of binding an appropriate antigen (S. K. Bhatia, J. L. Teixeira, M. Anderson, L. C. Shriver-Lake, J. M. Calvert, J. H. Georger, J. J. Hickman, C. S. Dulcey, P. E. Schoen and F. S. Ligler *Anal. Biochem.,* 208,197 (1993)). A second example, of relevance to microlithographic processing, involves covalent binding of a colloidal Pd(II) EL metal deposition catalyst at N ligand sites on a pyridyl silane modified substrate; subsequent reaction of the catalyzed surface with an EL metal deposition bath deposits metal onto those regions of the surface treated with the catalyst (W. J. Dressick, C. S. Dulcey, J. H. Georger, G. S. Calabrese and J. M. Calvert J. Electrochem. Soc., 141, 210 (1994).

The attachment mode for preferential grafting of the species to the surface reactivity template may be chemical in that formation of a covalent bond between the species and a specific surface functional group occurs. Physisorptive processes, such as hydrogen bond formation, electrostatic attraction or van der Waals interaction between the species and selected surface functional groups also form a basis for attachment. Note here that the term "preferential" is not necessarily equivalent to "selective". The term "selective" implies attachment of the species to either, but not both of, the exposed or the unexposed regions of the template. That is, attachment does not occur at all in one of these regions (at least to a degree that is above some lower limit of detection, or to a degree that affects the properties of the region) but does occur in the other to a degree that is detectable and/or affective of the properties. The adjective "preferential" is less restrictive and implies that grafting may deposit the species in differing amounts in both regions of the reactivity template. This situation is much more likely to occur than that of selective grafting. For example, attempts to covalently bind a species to substrate functional groups in the unexposed regions of the reactivity template may also lead to covalent binding at stray, unaltered functional groups remaining in the exposed portion of the template. An analogous situation could occur for the reverse tone process if stray radiation during the patterning process inadvertently creates altered functional groups, at lower densities, beyond the intended exposure boundary. The presence of surface impurities capable of reaction with the species via the chosen grafting chemistry or simple physisorption of the species may also promote such non-selective attachment.

Preferential grafting processes are generally adequate for the attachment of species to the reactivity template, provided that they do not ultimately compromise the envisioned application. For example, in the binding of DNA to alkylamine/silanol reactivity templates for the fabrication of genetic assay systems, DNA is bound in both the amine and silanol regions in a ratio of ~14:1, respectively (L. A. Chrisey, P. M. Roberts, V. I. Benezra, W. J. Dressick, C. S. Dulcey and J. M. Calvert *Proc. Mater. Res. Soc. Symp.*, 330, 179 (1994)). This binding differential is sufficiently large such that modem fluorescent or absorption detection techniques can be employed to discriminate between hybridization events occurring in each region, permitting use of such templates as a basis for assay development. An additional example involves the use of reactivity templates to control metal deposition onto a substrate for microlithography and electronic interconnect applications (W. J. Dressick, C. S. Dulcey, J. H. Georger, G. S. Calabrese and J. M Calvert, *J. Electrochem. Soc.,* 141,210 (1994)). In this case, treatment of a reactivity template comprised of pyridyl ligand and silanol functional groups with a Pd(II) EL catalyst precursor leads to nearly selective binding of Pd(II) at the pyridyl ligands sites; a binding ratio of ~100:1 for the pyridyl vs. silanol sites is estimated from Auger Electron Spectroscopy (AES) experiments. Because the quantity of Pd(II) present on the silanol regions of the template is far below that required to initiate EL metal deposition, treatment of the catalyzed template with an EL Ni plating bath selectively deposits a Ni metal film of measurable thickness and electrical conductivity only on those regions where intact pyridyl functional groups remain.

Selection of a type of actinic radiation will be influenced by the selection of the functional groups to be converted to photoproducts, and vice-versa. X-rays, UV light, and electron beams are suitable forms of actinic radiation for use in the invention. In particular, proximity x-rays, 193 nm UV light from an excimer laser, and 248 nm UV light from a KrF excimer laser have been shown to work for various embodiments of the invention. Ion beams and UV light from Hg penlamps should also prove suitable for use in the invention.

In the practice of this invention, grafting processes are utilized to fabricate either negative tone or positive tone replicas comprised of the material grafted onto a latent image defined by a surface reactivity template.

Negative tone replicas involve grafting of an independent species to that portion of the reactivity template corresponding to the exposed areas on the surface. The preferred substrate in this case is one whose surface prior to fabrication of the reactivity template representing the desired latent image comprises, at least in part, reactive 3-chloromethylphenyl and/or 4-chloromethylphenyl functional groups. Typical examples of such a substrate include pinhole-free polymer films, of thickness typically greater than ~30 nm, comprised of poly-3vinylbenzylchloride (3-PVBC), poly-4-vinylbenzylchloride (4-PVBC) or the corresponding copolymer containing both 3-chloromethylphenyl and 4-chloromethylphenyl isomers as side chain substituents (PVBC). Other examples include any material which does not intrinsically possess the CMP functional group as a portion of its structure and upon whose surface may be adsorbed by chemical or physical means a thin film of a material containing the requisite CMP functional groups. In this case, a preferred mode for modifying the surface of the substrate with CMP functional groups includes homogeneous chemisorption of an organosilane of chemical formula 3—(or 4)-$ClCH_2C_6H_4$-$(CH_2)_y SiX_3$ or 3-(or 4)-$ClCH_2C_6H_4$—$(CH_2)_y Si(CH_3)_2 X$ (where X is halide or alkoxide and y is a positive integer$\geq 0$) at hydroxyl residues naturally occurring or chemically produced on the substrate surface.

A general procedure for fabrication of reactivity templates and subsequent preferential grafting for the formation of negative tone latent image replicas comprised of grafted material is described below for a substrate having accessible CMP functional groups on its surface. The reactivity template is first formed by selective irradiation of desired portions of the surface through a mask or use of a direct write instrument as described above. Preferred exposure sources are excimer lasers tuned to deliver UV light at wavelengths of 193 nm or 248 nm operating under ambient conditions. Exposure using these tools leads to a loss of Cl from the surface as HCl gas. The material(s) remaining following Cl loss in the irradiated regions are oxidized species possessing surface aldehyde and carboxylic acid functional groups. The discussion of the mechanism for the formation of these species and their identification are well described in the examples below. The formation of aldehyde and carboxylic acid functional groups on the irradiated surface defines the reactivity template and forms a basis for covalent grafting of additional materials to the surface through these sites.

Subsequent grafting reactions in the irradiated regions of the reactivity template must be those which can be carried out in solvents which will not swell or dissolve the underlying substrate, thereby distorting or destroying the latent image defined by the template. In a preferred embodiment of the invention, such reactions are carried out in aqueous solution or in solutions of alcohols such as methanol or ethanol, which provide the added advantage of satisfying safety and environmental concerns. For the aldehyde and carboxylic acid residues formed by UV irradiation of the substrate, a variety of possible covalent grafting reactions satisfy these criteria. For example, carboxylic acid derivatives such as N-hydroxysuccinimidyl esters covalently tethered to substrate surfaces have been shown to bind amine residues of proteins (S. K. Bhatia, J. L. Teixeira, M. Anderson, L. C. Shriver-Lake, J. M. Calvert, J. H. Georger, J. J. Hickman, C. S. Dulcey, P. E. Schoen and F. S. Ligler *Anal. Biochem.*, 208, 197 (1993)) and alkylamine functionalized DNA strands (L. A. Chrisey, G. U. Lee and C. E. O'Farrell *Nucleic Acids Research*, 24, 3031 (1996)) to surfaces via amide bond formation. A preferred embodiment of the invention utilizes a reductive amination reaction involving the cyanoborohydride anion (i.e., $BH_3CN^-$) to attach a primary or secondary aliphatic amine to the surface aldehyde functional groups via formation of a covalent C—N bond (see e.g., R. F. Borch, M. D. Bernstein and H. D. Durst *J. Amer. Chem. Soc.*, 93, 2897 (1971), and references therein).

The type of material chosen for grafting to the exposed areas of the surface template will be dictated by the intended application. In general, however, the material will be of structure QZ, where Z is a functional group which can be attached to the surface and Q is a group possessing the appropriate combination of physical and chemical properties required for the application. Q may be identical with or different from Z. For covalent attachment modes, Z is preferentially a primary or secondary aliphatic amine for grafting to surface aldehyde residues or either a primary or secondary aliphatic amine or alcohol for grafting to surface carboxylic acid groups on the irradiated surface regions of the chloromethylphenyl-functionalized substrates. Possibilities for suitable Q include single strand DNA sequences useful as hybridization probes for genetic assays (L. A. Chrisey, G. U. Lee and C. E. O'Farrell *Nucleic Acids Research*, 24, 3031 (1996)) and antibody proteins useful for immunoassays (S. K. Bhatia, J. L. Teixeira, M. Anderson, L. C. Shriver-Lake, J. M. Calvert, J. H. Georger, J. J. Hickman, C. S. Dulcey, P. E. Schoen and F. S. Ligler *Anal. Biochem.*, 208, 197 (1993)).

Figure 2:
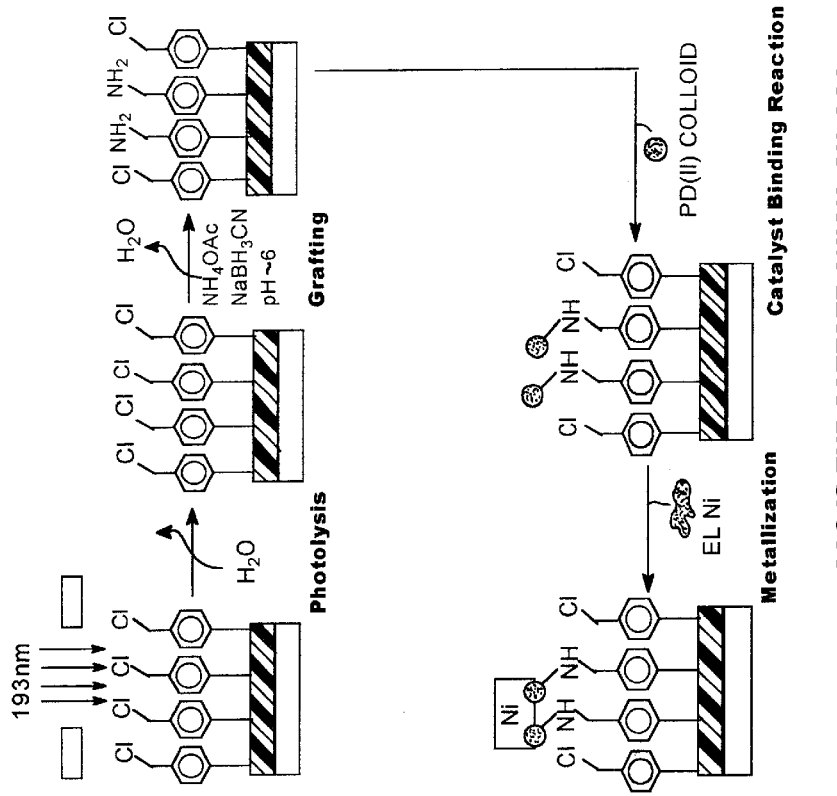
FIGS. 2A and 2B show negative tone grafting schemes.
Figure 2:
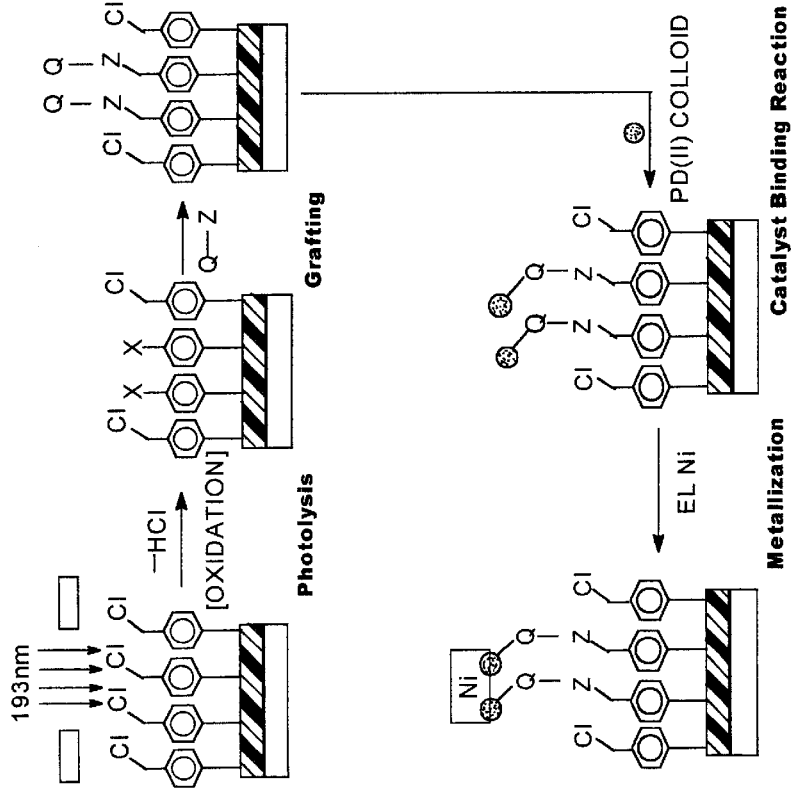
Figure 3:
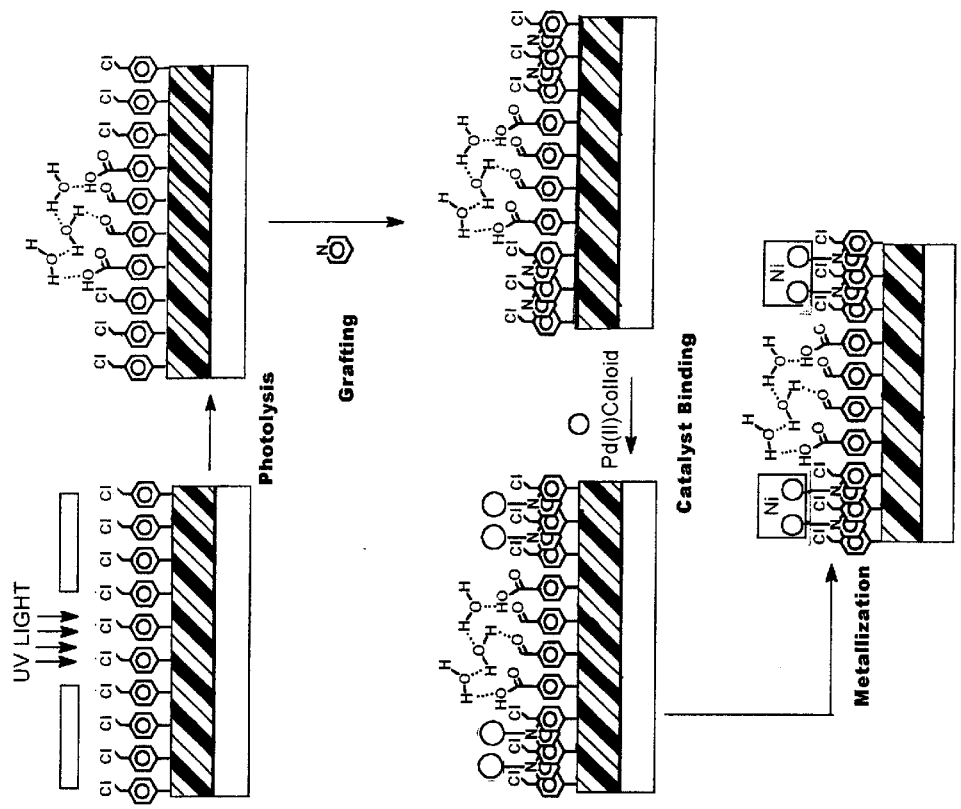
FIGS. 3A and 3B show positive tone grafting schemes.
Figure 3:
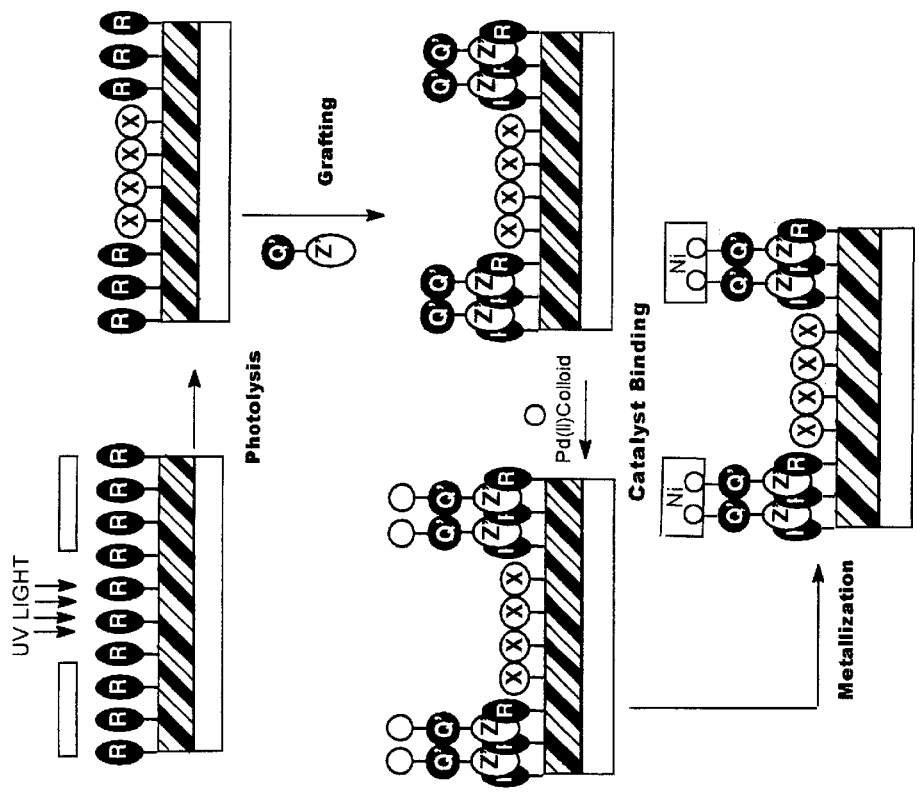

A species in which at least a portion of Q comprises a ligating group capable of binding metal ions such as Pd(II) is an especially preferred embodiment of the invention. Examples of this type include Q which consist wholly or in part of ligand groups such as thiol-, amino-, pyridyl-, diphenylphosphino-, or acetylacetonato- and Z consisting of aliphatic amines or alcohols as described above. When Q-Z is ammonium acetate, both the Q ligating and Z grafting functions are identically addressed by the $NH_3$ species, which is preferred due to its water solubility and safety and ease of handling. Especially preferred Q-Z are species having multiple aliphatic amine sites on each molecule and include ethylene diamine, diethylene triamine, and the Starburst® (PAMAM) dendrimers of generation "k" (where "k" is a positive integer$\geq 0$). For k=0, the dendrimer formula is $[-CH_2N(CH_2CH_2CONHCH_2CH_2NH_2)_2]_2$; each $k^{th}$ generation differs from the $(k-1)^{th}$ generation by addition of two $-CH_2CH_2CONHCH_2CH_2NH_2$ groups to each terminal $-NH_2$ group of the $(k-1)^{th}$ generation such that the number of terminal $NH^2$ groups in the $k^{th}$ generation dendrimer is $2_{(k+2)}$. Grafting of such materials ideally occurs via surface binding through one amine site, leaving the remainder of the amines to function as metal ion ligation sites in a procedure which effectively amplifies the concentration of surface ligand sites. Use of such Q-Z in FIG. 2 yields a grafted surface capable of preferentially binding an EL Pd(II) catalyst in the exposed regions of the template. Subsequent treatment of the catalyzed template with an EL metal bath leads to essentially selective metal film deposition in the exposed surface regions defining the original reactivity template. The metal patterns so formed are negative tone replicas of the latent image represented by the surface reactivity template. The metal patterns are sufficiently conductive for use as electrical interconnects and are sufficiently robust to withstand plasma RIE steps required to transfer the pattern of the latent image into the underlying substrate for lithographic applications.

The fabrication of positive tone latent image replicas comprised of grafted material requires preferential attachment of species to the original functional groups remaining on the unexposed regions of the surface following creation of a reactivity template. For CMP-based polysiloxane thin films, we have previously described a covalent grafting mechanism using ligand nucleophiles for fabrication of positive tone patterned Ni metal films on substrate surfaces. See U.S. Pat. No. 5,648,201, issued Jul. 15, 1997, incorporated by reference herein). The use of physisorptive, rather than covalent, attachment of materials to reactivity templates based on the CMP- and other functional groups provides an attractive alternative to chemically based grafting.

Figure 4:
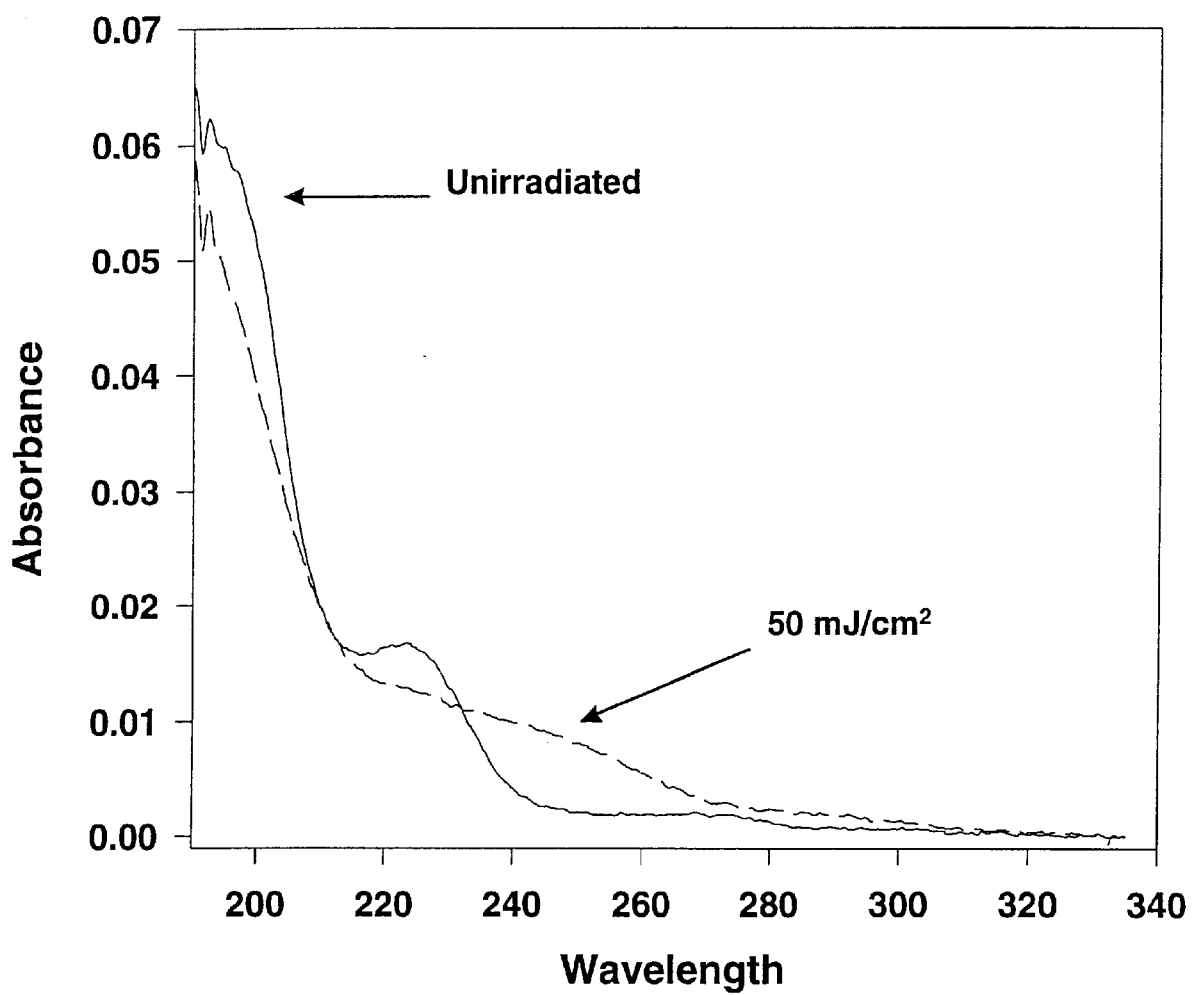
FIG. 4 shows the effects of deep UV irradiation on the UV absorption of CMPTS films.

The general concept of preferential attachment of species to a surface reactivity template through control of physisorptive interactions between the species and the different regions of the template is illustrated in FIG. 4, and is discussed below. Although the discussion herein illustrates the concept in terms of positive tone processes, the arguments presented are equally valid for negative tone systems. As shown in General Scheme (A), a reactivity template is first formed on a substrate surface by means of photopatterning using a mask or through direct write processes as described above in connection with negative tone covalent ligand grafting. The properties of the exposed areas of the template, designated "X", will differ from those in the masked areas, designated "R". Exposure often leads to the creation of new functional groups having very different chemical properties than the original surface. Such a process often occurs via a bimolecular reaction between an original functional group and another molecule during exposure and provides a basis for subsequent covalent surface grafting processes. Because chemical changes are often accompanied by changes in physical properties, one may also consider differences in hydrophobicities (wettability), electrostatic interactions, or hydrogen bonding abilities between the R and X regions as a means for preferential surface grafting based on physisorptive phenomena.

There also exist a number of photoprocesses in which the chemical reactivity of a functional group is not altered to the extent that covalent grafting of a species to the group can readily occur (N. J. Turro, *Modern Molecular Photochemistry,* Benjamin/Cummings Publishing Company: Menlo Park, Calif., 1978, Ch. 12). These include photoprocesses such as certain cis-trans double bond isomerizations, cycloaddition reactions, racemizations and sigmatropic rearrangements of polyenes, which involve internal bond rearrangements within a molecule rather than its reaction with other molecules during exposure. These processes can, however, significantly alter physical properties such as size (dimensions) and polarizability of molecules. Exposure of substrates whose surfaces are comprised, at least in part, of such molecules may provide an alternative means for establishing reactivity templates exhibiting the spatially modified physical properties required in this aspect of our invention. That is, X may consist of some isomeric form of R having sufficiently different physical properties to permit preferential physisorption of a species onto the reactivity template.

Following the exposure step, the surface is next treated with the material to be preferentially grafted to the template. This material will have the general structure, Q'-Z'. Here, Z' is that portion of the molecule having a functional group which strongly interacts with R moieties to preferentially bind Q'-Z' to the unexposed regions of the surface. The binding interactions between Z' and R are not covalent and may comprise hydrogen bond formation, electrostatic attraction, van der Waals attraction (e.g., hydrophobic interactions or dipole-dipole interactions), or any combination thereof. The interaction between Z' and the X in the exposed areas of the surface, if any, must be sufficiently weak to prevent binding of Q'-Z' in these areas in quantities which may compromise the intended application. Furthermore, the exposure dose during template fabrication must be properly chosen to minimize the number of unconverted R groups remaining in the exposed regions; the number density of such stray R groups must be kept as small as possible to maximize binding of the Z' functional group in the masked regions relative to the exposed sites.

The ability of certain materials to entrap others having similar physical properties through non-covalent interactions while excluding others with different physical properties is well established for systems involving liquid-liquid, solid-liquid and solid-gas interfaces. For example, micelles are well known for their abilities to entrain solution species through the establishment of mutually favorable noncovalent interactions (D. Myers, *Surfactant Science and Technology* VCH Publishers, Inc.: New York, 1988, Ch. 4). These include the establishment of hydrophobic interactions between surfactant alkyl chains within the micelle and hydrophobic sites of the solution species as well as electrostatic attractions between charged surfactant headgroups on the micelle and oppositely charged solution species, where appropriate. Cyclodextrins (CD), which consist of cyclic oligosaccharides comprising six, seven, or eight 1,4-linked glucopyranose units, possess a hydrophobic cavity bordered by two hydrophilic faces; host-guest complexes in which hydrophobic solution species are encapsulated within the cavity are well known and form the basis for numerous industrial applications (J. Szejtli, *Cyclodextrin Technology* Kluwer Academic Press: Dordrecht, 1988, and references therein). Antibodies likewise bind antigens noncovalently and single strand DNA effectively binds its complementary strand via formation of multiple hydrogen bonding interactions (A. L. Lehninger, *Biochemistry, 2nd Edition* Worth Publishers, Inc.: New York, 1975, and references therein).

These abilities to bind solution species often persist at solid-liquid or solid-gas interfaces formed when the material is deposited as a thin film onto a solid substrate. For example, surfactants have been shown to retain their abilities to entrap solution species following controlled deposition as Langmuir-Blodgett (LB) monolayer films on solid substrates (A. Ulman, *Introduction to Ultrathin Organic Films from Langmuir-Blodgett to Self-Assembly,* Academic Press: New York, 1994). Mechanistic studies indicate that entrapment phenomena are well described by a theory which relates the permeation of the species to its diffusion coefficient and other molecular parameters (see J. O. Milliken, J. A. Zollweg and E. G. Bobalek, *J. Colloid Interface Sci.,* 77, 41 (1980), and E. Dickenson, *J. Colloid Interface Sci.,* 63, 461 (1978)). Amphiphilic derivatives of CDs deposited as LB films have also been shown to retain their abilities to intercalate solution species (see, e.g., M. Matsumoto, M. Tanaka, R. Azumi, H. Tachibana, T. Miyasaka, W. Tagaki, H. Nakahara and K. Fukuda, *Thin Solid Films,* 210/211, 803 (1992)). Antibodies covalently tethered to a substrate form the basis for commercial immunoassay systems due in part to their abilities to preferentially bind antigens through noncovalent interactions (S. K. Bhatia, J. L. Teixeira, M. Anderson, L. C. Shriver-Lake, J. M. Calvert, J. H. Georger, J. J. Hickman, C. S. Dulcey, P. E. Schoen and F. S. Ligler *Anal. Biochem.,* 208, 197 (1993)). Single strand DNA preferentially adsorbed to alkylamine sites on amine/silanol surface reactivity templates through electrostatic interactions likewise exhibits the ability to efficiently hybridize a complementary DNA sequence from solution without significant desorption from the template (L. A. Chrisey, P. M. Roberts, V. I. Benezra, W. J. Dressick, C. S. Dulcey and J. M. Calvert *Proc. Mater. Res. Soc. Symp.*, 330, 179 (1994)). Consequently, the general concept of trapping species such as Q'-Z' on or in surface sites via physisorptive interactions is well supported in the scientific literature.

The Q' represents that portion of the Q'-Z' species possessing the appropriate combination of physical and chemical properties required for the application. For selective metal deposition illustrated, Q' comprises, at least in part, a metal ion ligating functional group such as thiol-, amino-, pyridyl-, diphenylphosphino-, or acetylacetonato- as described earlier for covalent grafting processes involving Q'-Z'. Because the Q' group must be accessible for further reaction following physisorption, it must not interact significantly with either the R or X regions on the surface template. The surface density of Q' sites in the unexposed R regions following binding must be sufficient to promote subsequent reactions at these sites; corresponding densities in the exposed areas should ideally be insufficient to support further reactions. Furthermore, the binding interaction between the R groups and Z' must not be compromised during subsequent reactions at Q'. For metal deposition, the ligand function of the Q' group must readily bind an EL metal deposition catalyst without loss of Q'-Z' from the surface template or activity of the bound catalyst. Furthermore, catalyst binding levels in each region of the template must be such that metal deposition is initiated and sustained in the unexposed regions and absent in the exposed regions. Under such conditions, selective deposition of a positive tone patterned metal film which replicates the latent image defined by the reactivity template will be achieved.

A preferred embodiment of the invention, illustrated in Scheme (B), is described below for fabrication of patterned EL metal films on substrate surfaces. In this embodiment of the invention, the substrate is preferably one whose surface comprises, at least in part, reactive 3-chloromethylphenyl- and/or 4-chloromethylphenyl-functional groups. Typical examples of such a substrate again include pinhole-free polymer films, of thickness typically greater than ~30 nm, including poly-3-vinylbenzylchloride (3-PVBC), poly-4-vinylbenzylchloride (4-PVBC) or the corresponding copolymer containing both 3-chloromethylphenyl and 4-chloromethylphenyl isomers as side chain substituents (PVBC). Other examples include any material which does not intrinsically possess the CMP functional group as a portion of its structure and upon whose surface may be adsorbed by chemical or physical means a thin film of a material containing the requisite CMP functional groups. In this case, a preferred mode for modifying the surface of the substrate with CMP functional groups includes homogeneous chemisorption of an organosilane of chemical formula 3-(or 4) -$ClCH_2C_6H_4$—$(CH_2)_ySiX_3$ or 3-(or 4) -$ClCH_2C_6H_4$—$(CH_2)_ySi(CH_3)_2X$ (Where X is halide or alkoxide and y is a nonnegative integer) at hydroxyl residues naturally occurring or chemically produced on the substrate surface.

Irradiation of the CMP-derivatized substrate surface, preferably using UV light at wave-lengths of 193 nm or 248 nm from an excimer laser, leads to Cl loss and eventual oxidation of the original CMP group to aldehyde (—CHO) and/or carboxylic acid (—COOH) functional groups. The irradiation is preferentially carried out by contacting the substrate with a mask defining the desired template. Following irradiation, a reactivity template comprised primarily of —CHO and —COOH groups in the exposed areas and CMP groups elsewhere is created on the substrate surface. The surface reactivity template is then treated with a ~0.1 M aqueous solution of pyridine ligand to preferentially adsorb the pyridine into the template. Subsequent treatment of the substrate with the PD1 EL catalyst for ~30 min or the PD2 EL catalyst for ~2 min deposits sufficient catalyst at the physisorbed pyridine sites in the unexposed regions of the template to initiate selective metallization of the template. Metal deposition produces a positive tone metal replica of the original template on the substrate surface.

The range of preferred EL Pd(II) catalyst binding species include 4,4'-bipyridine, dimethylamine borane (DMAB), and the borane adducts of 4-methylmorpholine, piperidine, 4-dimethylaminopyridine, trimethylamine and pyridine. The borane adducts of 2,6-lutidine and tert-butylamine are not preferred in this application; irreproducible metal deposition is observed for these materials. Physisorption of the ligand species from aqueous solutions is likewise preferred. For example, although an aqueous DMAB solution is effective in the deposition of EL metal, a methanol solution of DMAB fails to deposit sufficient ligand to ensure reproducible metallizations. Higher temperature solutions are likewise preferred for physisorption of ligand materials onto the template. For example, adsorption of dimethylamine borane onto a CMP-modified substrate is sufficiently complete after ~15 min at 60° C. to ensure complete metallization of the treated surface. At room temperature, a treatment time of ~3 days is required to obtain the same results.

While the exact nature of the interactions leading to preferential adsorption of the solution ligating species to the CMP-rich areas of the surface template is not yet certain, the behavior of these systems is consistent with a physisorption model. For example, physisorption of gases in LB films has been described using a model in which gas adsorption requires formation of a defect site (i.e., hole) in the film (see J. O. Milliken, J. A. Zollweg and E. G. Bobalek, *J. Colloid Interface Sci.*, 77, 41 (1980), and E. Dickenson, *J. Colloid Interface Sci.*, 63, 461 (1978)). Upon entering the hole, the molecule is stabilized through noncovalent interactions with the surrounding surfactant molecules. Although the formation of defects is enhanced at higher temperatures, the noncovalent stabilizing forces between the permeant gas molecule and surrounding surfactants are decreased. Consequently, at higher temperatures kinetic rates of entry and exit of the gas molecules are both increased such that an equilibrium situation is more rapidly established than at lower temperatures. A subsequent, rapid decrease in temperature can effectively trap the gas inside the film by healing defects and restoring the stabilizing noncovalent interactions with the surfactants which are disrupted at higher temperatures.

The behavior of the system of the present invention is similar in that incorporation of sufficient ligand to initiate metal deposition in the CMP-films occurs much more rapidly at higher temperatures than at lower temperatures. Polysiloxane films possessing aromatic substituents such as the CMP-group have been shown by Atomic Force Microscopy (AFM) to be more disordered and less densely packed than corresponding films having long chain alkylamine substituents (C. N. Durfor, D. C. Turner, J. H. Georger, B. M. Peek and D. A. Stenger, *Langmuir*, 10, 148 (1994)). Under such circumstances, entrainment of ligand species in CMP-films is not unexpected. Furthermore, because species possessing aromatic ring systems are capable of interacting with other aromatic rings through favorable van der Waals Π-cloud attractions, the CMP-films are expected to interact more strongly with aromatic species than aliphatic species.

In fact, treatment of DMAB grafted CMP-films with toluene, aqueous 1 M NaCl solution or ~0.1M MES pH ~5 aqueous buffer leaches dimethylamine ligand from the film, suppressing subsequent metallization. The use of a DMAB solution in methanol, which is a potential competitor for film binding sites, for the ligand grafting step ultimately leads to a lower extent of metallization, consistent with incorporation of reduced ligand levels in the film. In contrast, pyridine-grafted CMP-films treated by these reagents retain their ability to support full metallization of the surface, consistent with the presence of strong interactions in the system.

The preferential binding of ligand species in the unexposed, CMP-rich regions compared to the exposed, CMP-poor areas of the surface template, leading to selective metal deposition, is also consistent with a physisorptive model. UV irradiation converts the chloromethylphenyl-functional groups of the film to aldehyde and carboxylic acid species, which are known to associate in aqueous solution through the formation of hydrogen bonds with water molecules (J. March, *Advanced Organic Chemistry—Reactions, Mechanism and Structure,* 3rd Edition John Wiley & Sons, Inc.: New York, 1985, Ch. 3, and references therein). The formation of a similar, hydrogen bonding network at carboxylic acid and aldehyde sites on the surface template would effectively increase the steric bulk of each group due to the presence of the associated water molecules. Furthermore, the energy stabilization afforded by the formation of each hydrogen bond (~3–6 kcal/mole) would provide an additional barrier to physisorptive binding at the underlying aromatic rings. While binding in the irradiated regions would therefore require a considerable expenditure of energy to penetrate the interlaced hydrogen bonding network, no such problem would be encountered in the unexposed regions. Consequently, the behavior of the simple aliphatic and aromatic ligands at the surface reactivity template is well described by a simple physisorption model in which van der Waals, hydrogen bonding and steric effects are primarily responsible for the observed surface adsorption phenomena.

Having described the invention, the following examples are given to illustrate specific applications of the invention, including the best mode now known to perform the invention. These specific examples are not intended to limit the scope of the invention described in this application.

Materials: (4-chloromethyl)phenyltrichlorosilane (CMPTS) and (4-chloromethyl)phenyltrimethoxysilane (M-CMPTS) were obtained from United Chemical Technologies, Inc. and purified immediately prior to use by vacuum distillation. Polyvinylbenzylchloride (PVBC), a 60/40 mixture of the 3- and 4-isomers with average MW about 55,000 g/mole, was used without further purification from Aldrich Chemical Co. Dimethylamine-borane complex, borane-pyridine complex, borane-piperidine complex, borane-4-methyl morpholine complex, 4-(borane-dimethylamino)pyridine complex, borane-2,6 lutidine complex, borane-tert-butylamine complex, borane trimethyl amine complex, and pyridine were all obtained from Aldrich Chemical company and used as received. Toluene (Sureseal, 99.8% purity) and 1,1,1,3,3,3-hexamethyldisilazane (HMDS) were also used as received from Aldrich. The amine-reactive fluorescent dyes, monofunctional Cy3.5 and tetramethyl-rhodium-6-isothiocyanate (TRITC, isomer R), were purchased from Biological Detection Systems, Inc. and Molecular Probes, Inc., respectively.

The colloidal Pd(II) catalyst for electroless (EL) metal deposition, PD1, was prepared and used according to the literature procedure (W. J. Dressick, L. M. Kondracki, M-S. Chen, S. L. Brandow, E. Matijevic, J. M. Calvert, Colloids and Surfaces A: Physicochemical and Engineering Aspects, 108, 101 (1996), incorporated by reference herein). PD1 catalyst was generally used 7–14 days following preparation. A second colloidal Pd(II) EL metal deposition catalyst, PD2, was prepared according to the literature procedure (S. L. Brandow, M-S. Chen, T. Wang, C. S Dulcey, J. M. Calvert, J. F. Bohland, G. S. Calabrese, and W. J. Dressick *J. Electrochem. Soc.,* 144, 3425 (1997), incorporated by reference herein) with the following modification: Following room temperature incubation for 2 h and addition of a 0.3 wt % HCl(aq) aliquot to quench the colloid formation reactions, the dispersion was stabilized by mixing either (i) equal volumes of dispersion and 1.0 M NaCl(aq) solution prior to filtering for catalysis of modified PVBC films, or (ii) one volume of dispersion and three volumes of 1.0 M NaCl(aq) solution prior to filtering for catalysis of modified CMP-based polysiloxane films. PD2 catalyst was used within 4 h after preparation for EL metal deposition experiments. Components for the NIPOSIT™ electroless Ni metal deposition bath were obtained from Shipley Company and the full strength bath was prepared according to the manufacturer's instructions; the bath was diluted to 10% of full strength with DI water for use in the experiments.

All other reagents were ACS reagent grade or equivalent and were used as received except where noted. Deionized water of 18 MΩ resistivity was used for all experiments. Native oxide n-type Si (100) wafers (P-doped, 5.0–7.3 Ω-cm) were obtained from Wafernet, Inc. and fused silica slides (1 in. square, 1 mm thick) from Dell Optics, Inc. Nitrogen gas for drying wafers was obtained from liquid $N_2$ boiloff and was filtered through a 0.2 $\mu$m pore cellulose filter prior to use.

Substrate Cleaning: Substrates were cleaned prior to use by immersing wafers and slides in a 1:1 mixture of HCl/$CH_3OH$ for 30 minutes followed by triple rinses in deionized (DI) water and immersion in 18M $H_2SO_4$ for 30 minutes. Substrates were then triply rinsed in DI water followed by immersion in boiling DI water until required for film coating experiments.

Instrumentation: Solution phase and thin film UV spectra were determined with a Cary 2400 UV-VIS-NIR (Varian) spectrophotometer. Solution spectra were measured in gas tight cuvettes under a He atmosphere versus a corresponding solvent blank. Spectra of the thin films were obtained using films coated onto fused silica substrates; an optically matched, clean, uncoated fused silica substrate was used as a reference for the absorption measurement.

Contact angle ($\theta_w$) measurements were made using a Zisman-type goniometer. Static, sessile droplets (10 $\mu$L) of DI water were delivered from a micropipet onto film coated substrates. The reported values are averages of at least five independent measurements taken at different points on the substrate surface.

X-ray photoelectron spectroscopy (XPS) experiments were performed using a Surface Science Instruments SSX-100 spectrometer. The instrument was operated in fixed analyzer transmission using a monochromatic Al K$\alpha$ source. Infrared measurements were performed with a Nicolet Magna 750 FTIR spectrophotometer, using an FT-85 reflection accessory.

Laser desorption mass spectrometry (LDFTMS) was performed on a Nicolet 3T superconducting ion cyclotron resonance mass spectrometer. Films were placed inside the spectrometer chamber and irradiated by approx. 1 mJ/cm$^2$ ArF laser pulses. Desorbed photoproducts were postionized by an electron beam, trapped and mass analyzed.

Film thicknesses were measured using a Gaertner Model 115C scanning ellipsometer. Optical constants of the wafer substrates were determined by measuring the native oxide of a piece of clean Si wafer prior to coating with CMPTS or PVBC. The film was then treated as a second layer and the manufacturer's values for the refractive indices of CMPTS ($n_D^{20}$=1.5395) and M-CMPTS ($n_D^{20}$=1.5395). A refractive index of 1.59 was determined experimentally for PVBC by simultaneously measuring the refractive index and thickness of spun samples.

Atomic force microscope (AFM) images were collected at room temperature (approximately 22° C.) using a Nanoscope III AFM equipped with microfabricated silicon nitride cantilevers (Digital Instruments, Santa Barbara, Calif.). Samples were immersed in DI water and imaged using the fluid cell attachment for the AFM. Images were acquired as raster scans in a constant force mode with average forces of 1–3 nN. Imaging under fluid has several advantages including minimizing surface contaminants and allowing imaging at lower scanning forces. An image of a 15 nm×15 nm area was collected and then cropped to a 10 nm×10 nm area for analysis. Processing included a correction to flatten the image, a planefit, and a 3×3 median filter. Cross-sections were taken across the image to measure the peak to peak height and RMS surface roughness was calculated for each image. de

NEGATIVE TONE GRAFTING EXAMPLES

Example 1

Surface Functionalization with 4-chloromethyphenyltrichloro-silane

For the Formation of Polysiloxane Films with Controlled Thickness

This example illustrates the concept of building a polymer film containing photoreactive chloromethylphenyl functions to a controlled thickness on a substrate surface by reaction of a polymerizable monomer with reactive functional groups present at the substrate surface. A monomer containing polymerizable Si—Cl groups is reacted with Si—OH groups present on fused silica and native oxide Si wafer substrate surfaces in this example. The rate of film growth depended on the treatment conditions (e.g., humidity, temperature, time, CMPTS solution concentration) The CMPTS-treated Si wafers and fused silica slides obtained were evaluated using contact angle goniometry, AFM, ellipsometry and UV-visible spectroscopy techniques.

For general references on organosilane film formation see the following books: B. Arkles, "Silane Coupling Chemistry", in *Silicon Compounds: Register and Review*, eds. R. Anderson, G. L. Larson, and C. Smith, Huls America, Inc. (Piscataway, N.J., 1991), p. 59; E. Plueddemann, *Silane Coupling Agents*, Plenum Press (New York, 1991).

Cleaned fused silica and Si wafer substrates were removed from storage in a boiling DI water bath, rinsed with toluene, and blown dry with filtered $N_2$. Silicon wafers were cleaved into approximately 1"×3" pieces and both wafers and slides were placed in Coplin jars filled with toluene and transferred into a dry box. An Ar atmosphere of controlled humidity (<1 ppm $H_2O$) was maintained inside the chamber. A 1% (v/v) solution of CMPTS in toluene was prepared inside the dry box. Dilutions were made by placing either 10 ml (to form the 0.1% solution) or 1 ml (to form the 0.01% solution) of the 1% silane solution into 100 ml of toluene. Cleaned substrates were immersed in these solutions for varying amounts of time (1 min to 26 hours) at room temperature (22±2° C.) then triply rinsed with fresh toluene. Treated substrates were kept immersed in the final toluene rinse aliquot during removal from the dry box. The treated substrates were next removed from the toluene, immediately blown dry in a filtered $N_2$ gas stream, and then heat cured for 3 min at 120° C. on a programmable hotplate (VWR Series 400HPS).

For optically transparent substrates such as fused silica, film growth was conveniently monitored by measuring the intensity of the UV absorption band at 198 nm due to the chloromethylphenyl chromophore of CMPTS. Average film thickness b was calculated from Beer's law: b=A/(2εc), where A was the measured film absorbance, $\epsilon$ (=55,000 L $mole^{-1}cm^{-1}$) was the molar extinction coefficient measured for a known concentration of CMPTS in acetonitrile solution, and c was the effective surface concentration of a complete CMPTS monolayer film on the surface expressed in units of moles/L. The value of c used, ~5.2 M, was calculated from a molecular model for CMPTS using a cross-sectional adsorption area of 0.40 $nm^2$ and an effective molecular height of 0.8 nm for a single molecule of CMPTS bound to the substrate surface. The factor of 2 in the Beer's law expression accounts for the presence of CMPTS film on both sides of the fused silica substrate. Rapid increase in absorption intensity was observed for treatment times leading to monolayer CMPTS formation, with slower growth rates noted for longer treatment times. Film growth was faster for more concentrated CMPTS solutions, however, all solutions eventually reached a growth plateau, with A ~0.066, after a deposition time of 24 hours. From Beer's Law this absorbance corresponds to a film thickness of 0.74 nm, or a film approximately one molecule thick.

Growth curves for the deposition of CMPTS under these conditions were highly reproducible. It was noted, however, that if substrates were not vigorously rinsed upon removal from the treatment solution there was a significant increase in the amount of CMPTS material bound to the surface (in some instances absorbance was noted to increase by a factor of 2). This suggests that there is a physisorbed network of CMPTS molecules forming a second layer on the substrate surface. This network can be disrupted and physisorbed material removed simply by using a vigorous rinse step. This leaves the chemisorbed layer intact. Further vigorous rinsing and soaking in neat solvent fail to remove additional material. Alternatively, the vigorous rinse may be eliminated if the deposition of additional material is desirable to create thicker films. In either case a cross-linked network of siloxane bonds is formed within the film anchoring it to the underlying substrate surface. For the experiments described here all samples were vigorously rinsed before heat curing.

Ellipsometric measurement of effective CMPTS film thickness on Si wafers as a function of CMPTS treatment time permitted direct monitoring of film growth and continuity. Submonolayer films were associated with large relative errors in measured film thickness and variation in the average film thickness with position on the wafer substrate. Effective measured film thickness increased rapidly as a function of treatment time until average coverage of the surface by a monolayer was achieved and film growth reached a plateau. This corresponded to a measured film thickness of 0.8±0.1 nm (3σ), for films deposited onto silicon wafers.

Sessile water drop contact angles were first measured for each of the CMPTS-treated Si wafers. At least five measurements were made at widely spaced points on each wafer in order to assess the uniformity and completeness of the surface coverage by the CMPTS. A plot of the average contact angle obtained for each wafer versus the CMPTS treatment time indicated the presence of two distinct regions. At short treatment times, contact angle rose rapidly as the polymeric CMPTS film began to grow from the hydroxyl-rich native oxide Si surface ($\theta_w$~5–10°). At longer treatment times, the value of $\theta_w$ fluctuated within the narrow range of 70–75° consistent with the presence of an outer film surface comprised of mixed chloromethyphenyl and silanol functional groups.

AFM imaging was used to study the morphology of CMPTS film at various stages of film growth. The surface topography of deposited films was imaged by immersing the sample in DI water using the AFM fluid cell attachment and imaging in Contact Mode. Cross-sections were taken across the image to measure the peak to peak height and RMS surface roughness was calculated for each image. Peak-to-peak height, basically a measure of the lowest to highest point on the sample that the AFM tip can detect, was constant at low coverage. For absorbances of A≦0.023 the peak-to-peak height consistently measured 0.66±0.09 nm, corresponding essentially to the height of a single CMPTS molecule. However, for absorbances of A>0.023, the measured peak-to-peak height increased linearly with coverage. This indicates the beginning of multilayer growth well below the coverage corresponding to a densely packed monolayer. As CMPTS molecules are chemisorbed to the surface a mixture of chloromethylphenyl- and a limited number of unreacted Si—Cl groups, which were hydrolyzed to Si—OH and/or Si—O—Si groups during the solvent rinse and baking steps, are formed. For Si substrates treated by CMPTS for longer times, a slower, homogeneous film growth from these Si—Cl residues continues, leading to the formation of multilayers.

Example 2

Surface Functionalization with 4-chloromethyl-phenyl trimethoxysilane

For the Formation of Polysiloxane Films with Controlled Thickness

This example extends the concept illustrated in Example 1 to films prepared using reactive monomers containing the reactive Si—OR (R=alkyl) functional group. The Si—OR functional group is less reactive than the Si—Cl functional group, permitting better control of the film polymerization rate and film thickness.

A solution of 4-chloromethylphenyltrimethoxysilane (M-CMPTS) in toluene was prepared in a glove bag under Ar atmosphere by pipetting 6 mL of M-CMPTS into a 1000 mL flask containing 600 mL toluene. A 238 μL aliquot of glacial acetic acid was added to the flask to catalyze the hydrolysis of the M-CMPTS Si—OCH$_3$ bonds. The contents of the flask were mixed well and the flask was removed from the glove bag. Clean Si wafers and fused silica slides were removed from storage in the boiling water bath, dried as described in Example 1, and placed on a glass substrate holder rack. The M-CMPTS solution in toluene was transferred from the flask to a clean 800 mL beaker and the glass rack containing the wafers and fused silica slides was immediately immersed in the M-CMPTS solution. The apparatus was allowed to stand at room temperature in air (relative humidity approx. 45±5%) as the film formation reaction proceeded. Fused silica slides and Si wafers were periodically removed from the treatment solution, rinsed thoroughly once in toluene, and dried in a stream of filtered N$_2$. Each substrate was allowed to stand overnight in air at room temperature to complete the chemisorption of the M-CMPTS to the surface. The treated substrates were characterized by UV spectroscopy and ellipsometry as described in Example 1. The kinetics of M-CMPTS film formation exhibited behavior similar to that of CMPTS. However, formation of M-CMPTS films generally proceeded at a slower rate than that observed for the CMPTS films. The film formation rate was governed by substrate treatment time, temperature, humidity, silane concentration and acetic acid catalyst concentration. Consequently, a film of M-CMPTS (thickness ~0.8±0.2 nm) was obtained under our conditions following a 3 h treatment at 22±2° C. with the M-CMPTS solution. A film of thickness 1.4±0.3 nm was likewise obtained after a 20 h treatment with the same solution.

Example 3

Surface Functionalization with PolyVinylBenzylChloride (PVBC) Polymer

This example demonstrates the fabrication of a polymer film containing photosensitive chloromethylphenyl groups at a controlled thickness on a substrate surface via spincoating a solution of a polymeric material directly onto the substrate surface.

A 1% w/v solution of PVBC was prepared by adding 1.00 g PVBC powder to a 100 mL volumetric flask containing approx. 60 mL toluene. After the PVBC had completely dissolved, the flask was diluted to the mark with toluene and mixed thoroughly by inversion. A 10% v/v solution of HMDS in acetone was prepared and sufficient solution was transferred to a Tupperware™ container such that the solution depth in the container measured about 0.25 inch. The container was capped to prevent evaporation of the solution. Clean Si wafers and fused silica slides were removed from storage in the boiling water bath and dried as described in Example 1. The substrate surfaces exhibited measured $\theta_w$~5–10°. The wafers and fused silica slides were placed on a glass substrate holder rack and the assembly was placed in the Tupperware™ container such that the HMDS solution did not contact the substrates. The container was sealed and the reaction of the Si—OH groups on the cleaned substrate surfaces with HMDS vapor was allowed to proceed for 2 min. After this time, the container was reopened and the glass rack containing the treated substrates was removed. The $\theta_w$~34–38° were measured for the HMDS treated substrates.

HMDS treated substrates were next coated with PVBC film using the spincoater. A substrate was placed in the spincoater chuck and the toluene solution of the PVBC, which had been filtered through a 0.2 μm pore Teflon filter immediately prior to use, was applied to just cover the entire substrate. The spincoater was activated for 30 seconds with a spin speed of 4000 rpm to complete PVBC film formation. The coated substrate was removed from the spin chuck, placed on a glass substrate holder rack, and baked in a vented oven at 90° C. for 30 min to remove excess toluene from the PVBC film. Uniform PVBC film thicknesses of ~44±2 nm were measured by ellipsometry on Si wafers treated in this manner. PVBC films were likewise deposited on additional Si wafers and fused silica slides using other combinations of spin speed, spin time, baking time, baking temperature and PVBC concentration in toluene solution. A series of calibration curves were produced which permitted reproducible fabrication of pinhole-free, uniform films having thicknesses as little as 30 nm.

Example 4

Deep UV Photochemistry of Silane-Based Polymers Containing Benzyl Chloride Functional Groups This example illustrates the ability to chemically alter the nature of the chloromethylphenyl functionality in the outer layer(s) of silane-based polymeric films, such as those described in Examples 1, 2, and 3 by UV irradiation.

Silane-based polymeric films containing the chloromethylphenyl group were prepared on Si wafers and fused silica slides as described in Examples 1 and/or 2. Film-coated substrates were flood exposed by irradiation at 193 nm using an ArF excimer laser (Questek 2430) with a pulse width of ~17 ns operating at 10 Hz. The laser beam was homogenized and expanded to an area 2 cm×2 cm in the plane of the substrate using a series of fused silica lenses and apertures; laser beam power was measured in the substrate plane using a Scientech 372 power/energy meter. Laser pulse energies were kept ~1–2 mJ/cm$^2$/pulse in order to prevent ablative desorption of the film from the substrate. Total irradiation dose was varied from ~5 mJ/cm$^2$ to ~1000 mJ/cm$^2$.

Irradiation of either the CMPTS or M-CMPTS films at 193 nm leads to distinct changes in the UV absorption spectrum of the chloromethylphenyl chromophore. FIG. 4 illustrates the changes initially occurring using a monolayer CMPTS film as an example; similar changes occur for multilayer films at somewhat higher doses due to the increased film thickness. For doses ≦~50 mJ/cm$^2$, the intensity of the absorption band at ~198 nm decreases monotonically with increased dose; band intensity following delivery of 50 mJ/cm$^2$ of energy is approximately 15–20% the initial band intensity. The loss in intensity of the 198 nm absorption band is accompanied by the growth of a new absorption shoulder at ~240–260 nm. For film doses>~50 mJ/cm$^2$, the entire absorption spectrum decreases monotonically until total removal of the film from the substrate is achieved for doses≧1000 mJ/cm$^2$.

The behavior of the sessile water droplet contact angle of the film $\theta_w$ also exhibits two distinct regions as a function of exposure dose. Irradiation initially rapidly increases the wettability of the CMPTS film surface; $\theta_w$ decreases from an initial value of 67° prior to irradiation to a value of 33° for CMPTS films subjected to a dose of ~50 mJ/cm$^2$. Thereafter, continued irradiation of the film leads to a slower, monotonic decrease in $\theta_w$ until a limiting value of ~5–10° characteristic of a silanol-covered surface is reached at a dose of ~1000 mJ/cm$^2$.

The chemical changes occurring during irradiation were consistent with the presence of (at least) a two-step photochemical mechanism leading ultimately to complete removal of the chloromethylphenyl functional group from the substrate surface. In the first step, laser desorption Fourier-transform mass spectrometry experiments (LDFTMS) indicated that HCl was evolved from the films as the major photoproduct for irradiation doses≦~50 mJ/cm$^2$. Ellipsometry measurements of the irradiated films (~50 mJ/cm$^2$) showed that no significant change in film thickness could be detected, consistent with an absence of substantial Si—C bond photocleavage. X-ray Photoelectron Spectroscopy (XPS) studies of the irradiated films confirmed the loss of Cl and indicated the generation of oxidized C species in the film. Deconvolution of the XPS C(1s) band revealed a component at 287 eV, characteristic of an aldehyde or ketone, as the major surface photoproduct. A much smaller component was observed at 289 eV, consistent with some oxidation to a carboxylate species. Fourier-transform infrared (FTIR) studies of the irradiated film showed a strong, broad, somewhat structured, absorption band at approximately 1700 cm$^{-1}$, characteristic of the carbonyl functional group. The surface-bound aldehyde (or ketone) component was positively identified by its reaction with an acidic methanol solution of 2,4-dinitrophenylhydazine (DNPH) according to the literature procedure (see A. Vogel, *Vogel's Textbook of practical Organic Chemistry*, eds. B. S. Furniss, A. J. Hannaford, V. Rogers, P. W. G. Smith and A. R. Tatchell, John Wiley & Sons, Inc. (New York, 1978) p. 1111); dinitrophenyl groups bound to the irradiated film following DNPH treatment were detected by their characteristic broad UV absorption extending from approximately 320–460 nm, centered at 370 nm, and XPS N(1s) signal at 405 eV due to the NO$_2$ group. For further details of the spectral assignments see R. T. Morrison and R. N. Boyd, *Organic Chemistry*, 3rd ed., Allyn and Bacon, Inc. (Boston, 1979).

The second step of the photochemical mechanism, which becomes increasingly dominant at doses>~50 mJ/cm$^2$, involves cleavage of the oxidized aldehyde- (or ketone-) and carboxyl-containing residues from the substrate surface. Evidence in support of this step includes the monotonic decreases in UV absorption spectrum profile, $\theta_w$, and average film thickness, as measured by ellipsometry. Although the total area comprising the XPS C(1s) band also decreases steadily with increased dose as expected, an increase in the area of the 289 eV band component relative to the 285 eV component is also observed. This suggests the presence of an additional pathway involving oxidation of chloromethylphenyl and/or aldehyde (or ketone) photoproduct residues to carboxyl-containing species in the limit of very high dose in parallel with the cleavage step. The net process, however, is Si—C bond cleavage and leads ultimately to generation of free silanol groups on the substrate surface as observed previously for related organosilane films (W. J. Dressick and J. M. Calvert, *Jpn. J. Appl. Phys.*, 32, 5829 (1993), and references therein).

This example illustrates that the chemical nature of the chloromethylphenyl group can be changed as a function of irradiation dose following 193 nm irradiation of the CMPTS or M-CMPTS films.

Example 5

Deep UV Photochemistry of PVBC Polymer Films

This example demonstrates the ability to chemically alter the nature of the chloromethylphenyl functionality in the outer layer(s) of spincoated polymeric films, such as those described in Example 3, by UV irradiation of the films.

PVBC-coated Si wafers and fused silica slides were prepared with an average PVBC film thickness of 44 nm by the spincoating process described in Example 3. The PVBC-coated substrates were exposed to doses of 193 nm radiation in the range 0–100 mJ/cm$^2$ and characterized as described in Example 3. LDFTMS indicated that HCl was evolved as the primary photoproduct for doses in this range. After a dose of 75 mJ/cm$^2$, $\theta_w$ decreased from 75° to 37°, reflecting the increased wettability of the film surface following irradiation. An absorption shoulder due to the presence of a surface photoproduct appeared at ~260 nm during the irradiation and reached maximum intensity following a dose of ~60–65 mJ/cm$^2$. The presence of an aldehyde (or ketone) component in the surface photoproduct was definitively established by the following observations according to the procedures of Example 4: (1) strong IR absorption at 1700 cm$^{-1}$; and (2) presence of a component at 287 eV in the C(1s) XPS band.

This example illustrates that the chemical nature of the surface chloromethylphenyl groups on spin coated PVBC polymer films can be changed as a function of dose following 193 nm irradiation.

Example 6

Modification of Silane-Based Polymers Containing Chloromethylphenyl Functional Groups by Proximity X-ray This example illustrates the ability to chemically alter the nature of the chloromethylphenyl functionality in the outer layer(s) of silane-based polymeric films, such as those described in Examples 1 and 2, by irradiation of the films with proximity x-rays.

Silane-based polymeric films containing the chloromethylphenyl group were prepared on 4 inch diameter Si wafers as described in Examples 1 or 2. Film coated substrates were loaded into the wafer cassette at the University of Wisconsin synchrotron x-ray source. In an automated process wafers were moved from the wafer cassette and centered, aligned, and loaded on the stepper. The mask and wafer were locked together. The beamline remained stationary while the mask and wafer assembly was moved in an XY stepper to complete exposure. 1.2 cm×1.2 cm areas were flood exposed by irradiation with proximity x-rays at 0.9385 nm (800 MeV). Substrates were exposed under a gentle flow of N$_2$ gas and subjected to x-ray doses ranging from 50–1500 mJ/cm$^2$.

Chlorine loss from the CMPTS film was determined as a function of dose by monitoring the intensity of the XPS Cl(2p) signal at 200 eV relative to the intensity of the Si(2p) signal from the underlying wafer substrate as an internal standard. The Cl(2p) signal intensity decreased monotonically from an initial value of 5% surface Cl for an unirradiated sample to a value of 1% Cl following a 800 mJ/cm$^2$ exposure. A corresponding change in θ$_w$ from ~76° to a minimum value of ~51° occurred as the wettability of the surface increased with exposure dose. At exposure doses above 800 mJ/cm$^2$ the contact angle began to rise, plateauing at a value of ~70° for doses of 1200 mJ/cm$^2$ and above. This may be due to contamination writing or the formation of additional surface products at high doses. The presence of photoproducts containing oxidized carbon species on the irradiated surface at doses of 800 mJ/cm$^2$ and below was suggested by the appearance and monotonic growth of the XPS C(1s) signal component(s) in the ~286–289 eV energy region with increasing dose. These results indicate that the chemical nature of the chloromethylphenyl group can be changed as a function of dose following exposure of the CMPTS or M-CMPTS films to proximity x-rays.

Example 7

Modification of Spin Coated PVBC Polymer Films by Exposure to Proximity X-ray This example illustrates the ability to chemically alter the nature of the chloromethylphenyl functionality in the outer layer(s) of spin coated PVBC films, such as those described in Example 3, by irradiation of the films with proximity x-rays.

Spin coated PVBC films were prepared on 4 inch diameter Si wafers as described in Example 3. 1.2 cm×1.2 cm areas were exposed by irradiation with proximity x-rays at 0.9385 nm (800 MeV) as described in Example 6. Substrates were exposed under a gentle flow of N$_2$ gas and subjected to x-ray doses ranging from 50–1500 mJ/cm$^2$. Chlorine loss from the PVBC film was determined as a function of dose by monitoring the intensity of the XPS Cl(2p) signal at 200 eV relative to the intensity of the C(1s) signal from the underlying polymer as an internal standard. The Cl(2p)/C(1s) signal intensity decreased from an initial value of 10% for an unirradiated sample to a value of 7% following a 1100 mJ/cm$^2$ exposure. A corresponding change in θ$_w$ from ~90° to a minimum value of ~67° occurred as the wettability of the surface increased with exposure dose. The presence of photoproducts comprising oxidized species on the irradiated surface was suggested by an increase in the surface oxygen content, as measured by the XPS O(1s)/C(1s) ratio. The surface O(1s)/C(1s) ratio increased from ~1% wt. prior to irradiation to ~16% wt. following delivery of the 1100 mJ/cm$^2$ exposure dose.

This example illustrates that the chemical nature of the surface chloromethylphenyl groups on spin coated PVBC polymer films can be changed as a function of dose following exposure to proximity x-rays.

Example 8

Conversion of Surface Groups on UV Irradiated PVBC Films to Amine Ligands Using Ammonium Acetate This example demonstrates the ability to preferentially bind an —NH$_2$ species to the UV irradiated PVBC film from Example 5 via reductive amination of the surface-bound aldehyde (or ketone) groups. The procedure for reductive amination described in this example is a modification of the literature method (R. F. Borch, M. D. Bernstein, H. Dupont Durst, *J. Amer. Chem. Soc.* 93(12), 2897 (1971)).

An amine grafting solution, hereafter referred to as solution A1, was prepared by dissolving 7.5 g ammonium acetate (NH$_4$OAc) in 50 mL anhydrous methanol. After the solid had dissolved completely, a 0.33 g portion of sodium cyanoborohydride (NaBH$_3$CN) was quickly added and dissolved. The solution was capped and stored until required for the reductive amination experiment. The solution maintained sufficient activity for use for at least one week after preparation when kept tightly capped during storage. A second solution, labeled solution A2, was identically prepared in water rather than methanol. Reductive amination reactions were carried out as described below using either solution A1 or solution A2 with similar results.

Clean Si wafers and fused silica slides were spincoated with PVBC as described in Example 3. Samples of the PVBC-coated substrates were flood exposed with a 50 mJ/cm$^2$ dose of 193 nm radiation as described in Example 5. Other samples of the PVBC-coated substrates were kept as controls and were not exposed. Control and irradiated substrates were placed in a Coplin jar containing a sufficient amount of solution A1 to completely immerse the substrates. Irradiated substrates were removed from the solution following treatments of 5,15,30,60,180, and 1080 min, rinsed sequentially 3 times with methanol and then 2 times with water, and dried in a filtered stream of N$_2$ gas. Control samples were removed and likewise processed after a 1080 min treatment with solution A1.

Figure 5:
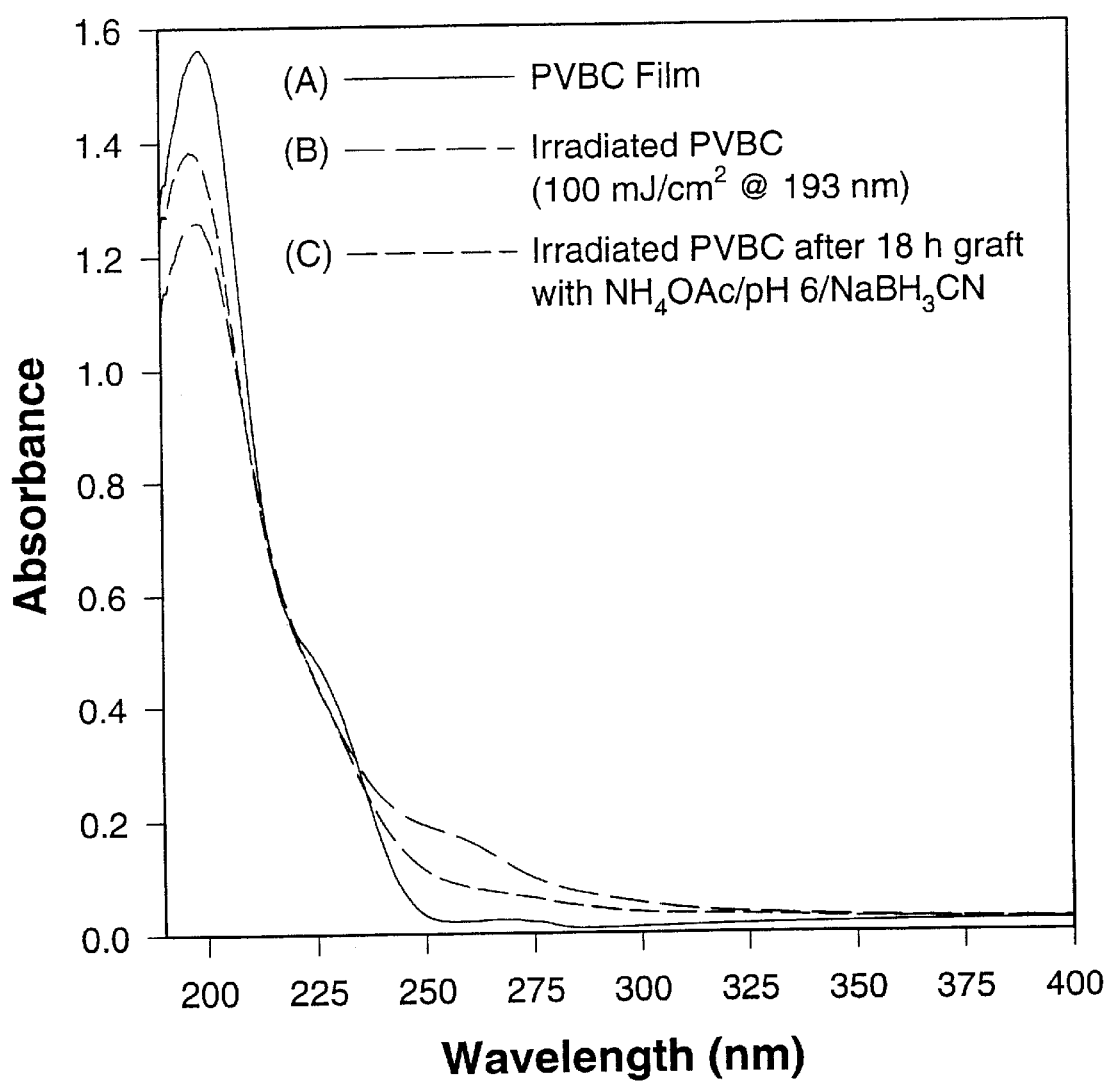
FIG. 5 shows a UV spectroscopy sequence for PVCB grafting.

The reductive amination of the surface bound carbonyl groups is monitored by UV absorption spectroscopy by following the disappearance of the absorption shoulder at ~260 nm characteristic of the aldehyde (or ketone) group with time. FIG. 5 shows limiting UV absorption spectra for a PVBC film before irradiation (A), after exposure with a 50 mJ/cm$^2$ dose of 193 nm radiation (B), and after treatment of the irradiated film for 1080 min with solution A1 (C). Because treatments of the irradiated substrates for times longer than 1080 min yield identical spectra to FIG. 2C, the reaction is judged complete at 1080 min. $\theta_w$ is ~39° for the film following treatment with solution A1 for 1080 min. Analysis of the UV spectra, corrected for minor slide-to-slide variations in PVBC film thickness, provides an estimate for the percentage of surface carbonyl groups converted to amines as a function of solution A1 treatment time. Table I lists the percent conversion ratio for each treatment time relative to (the assumed 100%) conversion after the 1080 min treatment. The estimated errors are ±10% for each entry.

TABLE I

| Reductive Amination Efficiency | |
| --- | --- |
| Treatment Time, min | Amine Grafting Efficiency, % |
| 0 | 0 |
| 5 | 26 |
| 15 | 41 |
| 30 | 57 |
| 60 | 75 |
| 180 | 87 |
| 1080 | 100 |

The presence of covalently bound amine functional groups on the irradiated PVBC film surface following reductive amination was confirmed by the results of XPS and amine-sensitive chemical tests. A band at 400 eV consistent with the presence of the —NH$_2$ group was observed during XPS N(1s) studies of treated films. Chemical testing for the presence of surface amine involved reaction of the film treated for 1080 min by solution A1 for 90 min with an aqueous solution of either Cy3.5 (~2 mg/50 mL) or TRITC (~2 mg/100 mL) in a darkened room. Samples were then rinsed thoroughly in water, dried with the filtered stream of N$_2$ gas, and examined using a UV lamp. Strong, characteristic sample fluorescence due to either Cy3.5 (scarlet) or TRITC (orange), as appropriate, was observed.

In contrast, analysis of the control samples following the 1080 min reductive amination treatment clearly indicated that essentially no reaction had taken place. The film UV absorption spectrum and sessile water drop contact angle ($\theta_w$~75°) were unchanged after treatment with solution A1. An XPS N(1s) signal at 400 eV due to the amine group, which was clearly seen for the irradiated films treated with solution A1, was not observed in the controls. In addition, treatment of the films with Cy3.5 or TRITC stains yielded no observable luminescence indicative of amines to the naked eye. These observations clearly indicate that reductive amination occurred preferentially at carbonyl residues present on the irradiated PVBC film surface.

This example illustrates that ammonium acetate reagent can be used to convert carbonyl residues present on the irradiated PVBC film surface to amine ligands.

Example 9

Conversion of Surface Groups on UV Irradiated Chloromethylphenyl-Functionalized Organosilane Films to Amine Ligands Using Ammonium Acetate This example demonstrates the ability to preferentially bind an NH$_2$-bearing species to the UV irradiated silane-based films from Examples 1 or 2 via reductive amination of the surface-bound aldehyde (or ketone) groups following the procedure of Example 8.

Clean Si wafers and fused silica slides were coated with CMPTS or M-CMPTS films as described in Examples 1 and 2, respectively. The coated substrates were processed and characterized as described in Example 8. The presence of amine functional groups on the irradiated films, but not the unirradiated control films, was confirmed by XPS N(1s) experiments and chemical reactivity experiments with the fluorescent Cy3.5 and TRITC dyes.

Example 10

Fabrication of Patterned Amine Reactivity Templates on UV Irradiated PVBC Using Ammonium Acetate This example describes a method for the fabrication of patterned amine reactivity templates on PVBC film surfaces at micron resolutions using the method described in Example 8.

Clean Si wafers and fused silica slides were spincoated with PVBC as described in Example 3. The PVBC film surface was placed in hard contact with a patterned chrome on fused silica mask and the mask/wafer assembly was placed in a holder aligned with the ArF laser beam for irradiation. A test mask pattern comprising variable metal line/spaces ranging from 1 µm×1 µm to 80 µm×80 µm was used and irradiation times were adjusted to compensate for attenuation of the beam (~15%) by the fused silica mask. The PVBC coated substrates were irradiated through the mask at 193 nm using the ArF excimer laser; the total energy dose delivered to the film surface was 50 mJ/cm$^2$. The mask was removed and the photopatterned substrate was treated overnight (1080 min) with solution A1 as described in Example 8. Substrates were removed from the treatment solution, rinsed successively times with methanol and then 2 times with water, and dried in a filtered N$_2$ gas stream. The substrates were next immersed in aqueous solutions of either Cy3.5 or TRITC, prepared as described in Example 8, for 90 min in a darkened room. The substrates were removed from the dye solution, rinsed with methanol and water, and dried with filtered N$_2$ as described above. The treated substrates were kept in a darkened area to prevent photobleaching of surface bound dye during the washing procedure and subsequent handling. Treated substrates were examined using a Molecular Dynamics Sarastro 2000™ Confocal Microscope System equipped with a Nikon OPTIPHOT 2™ microscope and a Nikon Model HB10101 AF Super High Pressure Hg lamp. Fluorescent patterns corresponding to the original pattern design of the mask were observed on the surface of the PVBC films. The pattern of the fluorescence was consistent with preferential binding of the dye on irradiated regions of the PVBC surface; i.e., a negative tone fluorescent image of the mask pattern was observed. Fluorescent line/space patterns as small as 1 µm×1 µm were observed, indicating that resolution was mask limited in this case. Quantization of the fluorescence intensity measured in the irradiated and masked regions of the patterned area indicated that the degree of preferential grafting (for the reductive amination and dye binding reaction sequence) was at least 3:1. These results clearly demonstrated that preferential amination of photopatterned PVBC films could be accomplished at micron resolutions using our process.

Example 11

Selective EL Metallization of UV Photopatterned PVBC Films Using Ammonium Acetate Grafting Chemistry and the EL Catalyst PD2

This example describes a method for the fabrication of patterned negative tone metal films on PVBC film surfaces at micron resolutions using the PD2 catalyst system.

The experiment of Example 10 was repeated with omission of the final step involving reaction of the surface amine pattern with the Cy3.5 and TRITC dyes. The surface amine template was instead reacted with colloidal Pd(II) EL metal deposition catalyst by treatment of the wafer with PD2 catalyst dispersion for 2 min. The excess PD2 dispersion was removed using a Pasteur pipes and discarded. The wafer was gently rinsed 3 times with DI water and the rinsings were discarded. The wafer was immediately immersed in a 10% strength aqueous NIPOSIT™ electroless Ni metal deposition bath and allowed stand in the bath at room temperature (22±2° C.) for 20 min. The wafer was occasionally agitated to remove bubbles formed on the PVBC surface, if any, during this time. The wafer was then removed from the Ni bath, rinsed 3 times with DI water, dried using the filtered $N_2$ gas stream, and examined to determine the extent, quality and selectivity of the Ni metallization. A patterned Ni metal film corresponding to the original pattern design of the mask was observed on the surface of the PVBC film. The metal pattern was consistent with selective binding of the Pd(II) catalyst and subsequent electroless Ni deposition on the irradiated regions of the PVBC surface; i.e., a negative tone metal image of the mask pattern was observed. Ni line/space patterns as small as 1 μm×1 μm were observed, indicating that resolution was mask limited in this case.

These results demonstrated that fabrication of patterned electroless metal films on the PVBC film surface could be accomplished at micron resolutions using the PD2 catalyst system.

Example 12

Catalyst Effect in the EL Metallization of UV Photopatterned PVBC Films Using Ammonium Acetate Grafting Chemistry This example illustrates the influence of the EL catalyst chosen on the ability to metallize the —$NH_2$ reactivity templates fabricated using the UV photpatterning process of Example 11.

The experiment described in Example 11 was repeated with the following single change: The surface amine template was treated for 30 min using the PD1 catalyst dispersion rather than for 2 min using the PD2 catalyst dispersion. Evaluation of the samples following the metallization step indicated that metal deposition was very irreproducible. In some cases, portions of the film surface corresponding to features from the mask pattern dies were selectively metallized. In other attempts, immersion of the catalyzed sample in the EL Ni bath resulted in essentially no metal deposition onto the surface.

Although the cause remains uncertain, the metallization behavior of PD1 in this instance relative to PD2 in Example 11 is consistent with differences in the surface properties and catalytic activities of the colloidal Pd(II) particles comprising each catalyst (S. L. Brandow, M-S. Chen, T. Wang, C. S. Dulcey, J. M. Calvert, J. F. Bohland, G. S. Calabrese, and W. J. Dressick J. *Electrochem. Soc.*, 144, 3425 (1997)). However, regardless of the origin of the effect, this example clearly demonstrates that the ability to fabricate patterned EL metal films on UV irradiated PVBC surfaces grafted with ammonium acetate depends upon the EL catalyst chosen.

Example 13

Grafting of Molecules Containing Multiple Amine Ligand Sites to UV Photopatterned PVBC Films for Selective EL Metallization Using PD1 Catalyst This example illustrates the ability to utilize small organic molecules containing more than one primary (or secondary) aliphatic amine N site in a reductive amination process to effectively enhance surface ligand density such that selective EL metallization of UV irradiated regions of PVBC films can be accomplished using a PD1 catalyst.

The following amines were used in this experiment: ethylenediamine (ED), diethylenetriamine (DET) and Starburst™ (PAMAM) dendrimer generation 0 (STAR). These amines possess 2, 3, and 4—$NH_2$ ligand sites per molecule, respectively. Consequently, if attachment to a surface aldehyde (-ketone) site is limited to a single amine site for each molecule, an enhancement of the amine ligand surface density compared to ammonium acetate is realized. The reductive amination reactions described below were carried out using solutions of these amines in methanol, rather than water, to better wet the PVBC film surface. Because the reductive amination grafting reaction proceeded best under slightly acidic conditions, solutions were first prepared by separately dissolving 1–2 mLs of each amine in 50 mLs DI water and titrating dropwise with glacial acetic acid to pH ~6.0–6.5 (as determined using pH paper). Corresponding solutions in 50 mL methanol were then prepared using the quantities of amine and acetic acid determined for the aqueous solutions; grafting solutions were prepared by addition of 0.33 g portions of $NaBH_3CN$ to each of the methanol solutions. The grafting solutions were each stoppered until needed for use in the experiment.

Clean Si wafers and fused silica slides were spincoated with PVBC as described in Example 3. The PVBC film surface was placed in hard contact with a patterned chrome on fused silica mask having features with resolutions to 2 μm. The mask/wafer assembly was placed in a holder aligned with the ArF laser beam for irradiation. The PVBC coated substrates were irradiated through the mask at 193 nm using the ArF excimer laser; the total energy dose delivered to the film surface, corrected for attenuation of the beam (~15%) by the fused silica mask, was 50 mJ/cm². The mask was removed and the photopatterned substrate was treated for 1080 min in a grafting solution of the appropriate amine in a Coplin jar. The wafer was then removed from the grafting solution, rinsed sequentially 3 times with methanol, 2 times with water, and dried in a filtered stream of $N_2$ gas. The treated PVBC films were then placed in a Coplin jar containing isopropyl alcohol for 16 h. The substrate was removed from the isopropanol bath, rinsed twice with fresh isopropanol, then rinsed three times with DI water, and finally dried in a filtered stream of $N_2$ gas.

The samples were then each catalyzed with PD1 for 30 min, gently rinsed with DI water three times, and placed in a room temperature 10% strength NIPOSIT™ EL Ni deposition bath for ~10 min. Samples were removed from the Ni bath, rinsed twice with DI water, dried in a stream of filtered $N_2$ gas, and examined using an optical microscope to determine the extent of metallization of the template features. Patterned PVBC films grafted using ED and DET generally exhibited poor, irreproducible pattern metallization. In some cases, portions of the film surface corresponding to features from the mask pattern dies were selectively metallized. However, in other cases, little or no metallization of the surface pattern was observed.

For the substrates grafted using the STAR solution, Ni deposition was selective and more reproducible. Ni metal was deposited over 80–100% of the irradiated region of the film defining the surface pattern, although in some of the metallized areas the thickness of the Ni was clearly diminished relative to others. The 2 μm features corresponding to the highest resolution structures present on the mask were selectively metallized in this case.

This behavior demonstrates that small organic molecules possessing multiple ligand sites can be used in the reductive amination grafting process to effectively amplify surface ligand densities to permit selective metallization of patterned PVBC films using the PD1 catalyst.

Example 14

Influence of Non-specific (Physisorption) Interactions of Amine Ligands on the Selective Metallization of UV Photo Patterned PVBC Substrates This example demonstrates the ability to disrupt the selectivity of the metal deposition process on UV patterned PVBC films through non-covalent adsorption of amine ligand to the unexposed regions of the PVBC reactivity template.

The experiment of example 13 was repeated using the STAR amine ligand with one change in procedure. Following completion of the reductive amination step, the sample was again rinsed three times with methanol, twice with DI water and dried in a stream of filtered $N_2$. However, the isopropanol rinse step was now omitted. The sample was instead directly catalyzed with PD1 and metallized according to the procedure of Example 13. Under these circumstances, metal deposition occurred nonselectively over the entire catalyzed portion of the substrate. Observation of the sample during metallization indicated that metal growth initiated more rapidly in the exposed areas of the surface template, leading to somewhat thicker Ni levels in these areas. Consequently, the original latent image was readily identified under the optical microscope by the presence of raised metal areas in the resulting Ni metal field.

This example shows that failure to remove non-covalently bound ligating material remaining on the PVBC surface after completion of the covalent ligand grafting step can compromise selectivity during subsequent metallization of the reactivity template.

Example 15

Selective EL Metallization of Proximity X-ray Patterned CMP-Based Polysiloxane Films Using Ammonium Acetate Grafting Chemistry and EL PD1 Catalyst This example demonstrates the ability to selectively metallize films of CMPTS and M-CMPTS following irradiation with x-rays, selective grafting of the irradiated film with amine as described in Example 8, and catalysis with PD1.

Clean Si wafers were coated with either CMPTS or M-CMPTS as described in Examples 1 and 2, respectively. Areas measuring 1.2×1.2 cm were irradiated with doses of 50, 100, 200, 400, and 800 mJ/cm² as detailed in Example 6. Following irradiation, the wafers were treated with solution A1 from Example 8 for 3 h. The wafers were then catalyzed for 40 min with the PD1 EL catalyst dispersion. Excess catalyst was removed using a Pasteur pipes and discarded. The wafers were gently rinsed 3 times with DI water and then metallized using the room temperature 10% strength NIPOSIT™ Ni bath for 20 min. Following metallization, the wafers were rinsed twice with DI water, dried using a stream of filtered $N_2$ gas, and visually examined to determine the extent and quality of Ni deposition. Irradiated areas on all wafers metallized fully without metallization of the unirradiated portions of the films. This indicates that irradiated PVBC films can be preferentially grafted with amine ligands, catalyzed and selectively metallized with Ni using proximity x-rays as the exposure source for film patterning.

POSITIVE TONE GRAFTING EXAMPLES

Example 16

Incorporation of Amine Bearing Ligands and Subsequent Electroless Metallization of Benzyl Chloride Silane Films Treated with Dimethyl Amine Borane Complex This example demonstrates the ability to incorporate amine bearing ligands into films of CMPTS or M-CMPTS by treatment with aqueous dimethylamine borane (DMAB) solutions. Silane surfaces modified with DMAB are then suitable for binding the PD1 or PD2 catalyst for subsequent electroless metallization.

Silane based polymeric films containing the chloromethylphenyl group were prepared on Si wafers and fused silica slides as described in Examples 1 or 2. Film coated substrates were submerged in either a 1.0 M DiMethyl Amine Borane (DMAB) solution in DI water or a 0.1M DMAB solution in MeOH. Both solutions were maintained at a constant temperature of 60° C. in a programmable water bath. Substrates were treated for 5, 10, 20, 30, 40, 60, 120, and 180 minutes, rinsed three times with DI water, and dried in a filtered stream of $N_2$ gas.

Samples which had been treated with DMAB were then treated with PD1 catalyst for 20 min or PD2 catalyst for 2 min. Excess catalyst was removed from the sample surface using a Pasteur pipet and discarded. The samples were gently rinsed 3 times with DI water and the rinsings were discarded. The wafers were immediately immersed in a 10% strength aqueous NIPOSIT™ electroless Ni metal deposition bath and allowed to stand in the bath at room temperature (22±2° C.) for 20 min. The wafers were occasionally agitated to remove any bubbles formed on the surface during this time. Wafers were then removed from the Ni bath, rinsed 3 times with DI water, dried using the filtered $N_2$ gas stream, and examined to determine the extent, quality and selectivity of the Ni metallization. Good blanket metallization was obtained on samples treated with the aqueous DMAB solution. However, samples treated with 0.1M DMAB in MeOH exhibited poor metallization. The Ni metallization results are shown in Table I for samples treated with aqueous DMAB and catalyzed using PDT; similar results are obtained using PD2 as the catalyst.

TABLE II

Metallization Efficiency on Aqueous
DMAB (0.1 M, 60° C.) Treated Silane Films

| DMAB Treatment Time, Min | Ni Metallization Area (%) |
|---|---|
| 5 | 0 |
| 10 | 0 |
| 20 | 90 |
| 30 | 100 |
| 40 | 100 |
| 60 | 100 |
| 90 | 100 |
| 120 | 100 |
| 180 | 0 |

Ni metallization entries in Table II represent the fraction of the catalyzed film area which metallized following immersion in the Ni bath. Treatment of silane surfaces with an aqueous DMAB solution for times ranging from 30 minutes to two hours gave homogenous metallization of good quality over 100% of the catalyzed area. Further treatment with DMAB resulted in a loss of metallization capability. Treatment with aqueous 0.1M DMAB solutions at room temperature (pH=8.5) was also investigated. Modification of the surface was found to proceed at a much slower rate at decreased temperatures. Complete 100% blanket metallization of DMAB treated CMPTS films was attained for samples which had been treated at room temperature for 72 hours.

The reaction of silane films with aqueous DMAB solutions was studied further. Examination of the UV absorption spectrum of each slide showed a uniform decrease in spectrum intensity with increased DMAB treatment time; the formation of new peaks was not observed during the treatment. Absorption intensity approached zero for samples treated with DMAB for times >180 min. A corresponding monotonic decrease in $\theta_w$ from ~70° prior to DMAB treatment to ~22° following treament for 180 min was observed. A linear correlation between the UV absorption spectrum intensity and $\theta_w$ was observed, consistent with stripping of the silane film from the surface in the basic DMAB solution treatment (pH ~9) (A. W. Snow et al., Langmuir 2 513 (1986)). Chlorine loss from the silane films, as measured by the intensity of the 200 eV XPS Cl(2p) signal relative to the intensity of the Si(2p) signal from the underlying wafer, also increased with longer DMAB treatment times consistent with stripping. Film stripping was eventually confirmed by ellipsometry, which indicated ~90% removal of the film for DMAB treatment times >180 min.

Fourier transform mass spectroscopy (FTMS) of DMAB treated films indicated that little reduction of the C—Cl bond in the chloromethylphenyl group occurred during the film stripping. FTMS showed HCl as the major radiative product lost from the surface for samples treated with DMAB for various times. Only trace amount of toluene, the photoproduct expected if reduction of the C—Cl bond occurred, were observed.

The N(1s) XPS spectrum of a film treated 30 min in DMAB exhibited a peak at 400 eV, consistent with some incorporation of the dimethylamine group into the film. Vigorous bubble formation was observed during treatment of the silane surfaces, indicating decomposition of the borane complex and the evolution of hydrogen gas. XPS examination of DMAB treated samples did not detect any surface bound boron and treatment of DMAB samples with 0.1 M HCl, to react and remove any residual reductant on the surface, did not effect the metallization behavior.

An attempt was made to limit stripping of the silane film through control of pH during film treatment with DMAB solution. Aqueous solutions of 0.1M DMAB containing 0.1M buffer were prepared using the following buffers: MES (2-morpholineoethanesulfonic acid; pH=6.5), HEPES (N-2-hydroxyethylpiperazine-N'-2-ethanesulfonic acid; pH=7.0), and PHOS (sodium hydrogen phosphate; pH=7.0). CMPTS substrates were immersed in each of the DMAB/buffer combinations, kept at 60±3° C. in a programmable water bath, for 30 min, triply rinsed with DI water, catalyzed with the PD1 solution and metallized as described above. However, all samples exhibited poor metallization (<10% surface area), consistent with buffer interference in the DMAB adsorption process.

Example 17

Electroless Metallization on PVBC Films Treated with DMAB

This example demonstrates the ability to incorporate an amine ligand into a PVBC film by treatment with dimethyl amine borane complex. Treated samples were suitable for binding a Pd catalyst for subsequent EL metallization.

PVBC coated silicon wafers were prepared as detailed in Example 3. Samples were sequentially treated with a 0.1M solution of DMAB, the PD1 catalyst and EL Ni bath as detailed in Example 16. Samples exhibited complete blanket metallization over all treated areas.

Example 18

Electroless Metallization of Phenyltrichlorosilane Films Treated with Dimethyl Amine Borane Complex This example demonstrates the ability to incorporate amine bearing ligands into films of phenyltrichlorosilane by treatment with aqueous DMAB solutions. Modified surfaces are then suitable for binding a Pd catalyst for subsequent EL metallization.

Silane based polymeric films of phenyltrichlorosilane were prepared as described in C. S. Dulcey, et al., Langmuir 12, 1638 (1996). The film coated substrates were treated with an 0.1M aqueous solution of DMAB for 10, 20, and 40 min at 55° C. Treated samples were then metallized using the PD1 catalyst as detailed in Example 1. The Ni metallization results are shown in Table III.

TABLE III

Metallization Efficiency on Aqueous DMAB (0.1 M, 55° C.) Treated Phenyltrichlorosilane Films

| DMAB Treatment Time (min) | Ni Metallization Area (%) |
| --- | --- |
| 10 | 50% |
| 20 | 100% |
| 40 | 100% |

Treatment times of 20–40 min were sufficient to achieve complete blanket metallization.

Example 19

Electroless Metallization on Benzyl Chloride Silane Films Treated with Amine-Borane Complexes This example demonstrates the generality of the surface modification procedure outlined in Example 16 using different amine-borane complexes.

Silane based polymeric films containing the chloromethylphenyl group were prepared on Si wafers and fused silica slides as described in Example 1. Solutions (0.1M in DI water) were prepared from each of the following five compounds: Borane-4-methylmorpholine complex, borane-piperidine complex, borane-tert-butylamine complex, borane trimethylamine complex, and borane pyridine complex. Solutions (0.1M in MeOH) were also prepared from 4-(boranedimethylamino pyridine) and borane-2,6-lutidine complex. The treatment solutions are summarized in Table IV.

TABLE IV

Amine Borane Complex Treatment Solutions (0.1 M, 60° C.)

| Reagent # | Reagent Name | Solvent | pH |
| --- | --- | --- | --- |
| I | borane-4-methylmorpholine complex | DI H$_2$O | 8 |
| II | borane-piperidine complex | DI H$_2$O | 9 |

TABLE IV-continued

Amine Borane Complex Treatment Solutions (0.1 M, 60° C.)

| Reagent # | Reagent Name | Solvent | pH |
|---|---|---|---|
| III | 4-(borane-dimethylamino pyridine) | MeOH | 9 |
| IV | borane-2,6-lutidine complex | MeOH | 8 |
| V | borane-tert-butylamine complex | DI $H_2O$ | 9 |
| VI | borane trimethylamine complex | DI $H_2O$ | 7 |
| VII | borane pyridine complex | DI $H_2O$ | 7 |

All solutions were maintained at a constant temperature of 60° C. in a programmable water bath. CMPTS coated substrates were immersed in each of the seven solutions for either 15, 30, or 45 min. Following treatment each substrate was triply rinsed with DI water and dried in a filtered stream of $N_2$ gas. A significant drop in UV absorption intensity (~30–40%) and a corresponding drop in contact angle for samples treated with solutions of pH=9 were consistent with film stripping. Treatment solutions with pH=7 to 8 did not result in film stripping during treatment. Samples were catalyzed with the PD1 catalyst and metallized as detailed in Example 16. Treatment of surfaces with a 0.1M HCl solution prior to metallization, in order to remove any residual reductant present on the surface, did not significantly effect metallization quality or efficiency. The Ni metallization results are shown in Table V.

TABLE V

Metallization Efficiency on Silane Films Treated with Amine Borane Complexes

| | Borane-Amine Treatment Time: | | |
|---|---|---|---|
| Reagent # | 15 min | 30 min | 45 min |
| I | 100 | 100 | 100 |
| II | 100 | 100 | 100 |
| III | 100 | 100 | 100 |
| IV | 30 | 40 | 60 |
| V | 25 | 25 | 25 |
| VI | 100 | 100 | 100 |
| VII | 100 | 100 | 100 |

Ni metallization entries in Table V represent the fraction of the catalyzed film area which metallized following immersion in the Ni bath. Treatment with all compounds, except Reagents IV and V, produced blanket metallization over the entire treated surface.

Example 20

Electroless Metallization of Benzyl Chloride Silane Films Treated with Pyridine Compounds This example demonstrates the ability to incorporate amine bearing ligands into films of CMPTS by treatment with aqueous pyridine solutions. Modified surfaces are then suitable for binding a Pd catalyst for subsequent EL metallization.

Silane based polymeric films containing the chloromethylphenyl group were prepared on Si wafers as described in Example 1 for CMPTS. Aqueous 0.1M solutions of pyridine (solution pH=7.5) and 4-4'-bipyridine were prepared and kept at a constant temperature of 60° C. in a programmable water bath. Separate CMPTS samples were immersed in each solution. Substrates were treated for 30 min, triply rinsed with DI water, and blown dry with a stream of filtered $N_2$. Surfaces treated with pyridine and 4-4'-bipyridine exhibited contact angles of 57°±2° and 49°±2°, respectively, as compared to a contact angle of 60–70° for the untreated benzyl chloride surface. An XPS scan of the pyridine treated sample indicated the presence of a N(1s) signal at 400 eV, consistent with the incorporation of pyridine by the film. Samples were metallized using the PD1 catalyst as described in Example 16. Both pyridine and 4-4'-bipyridine treated surfaces exhibited complete blanket metallization over all treated areas.

Example 21

Electroless Metallization of Phenyltrichlorosilane Films Treated with Pyridine Compounds This example demonstrates the ability to incorporate amine bearing ligands into films of phenyltrichlorosilane by treatment with aqueous pyridine solutions. Modified surfaces are then suitable for binding a Pd catalyst for subsequent EL metallization.

Silane based polymeric films of phenyltrichlorosilane were prepared as described in Example 18. The film coated substrates were treated with a 0.1 M aqueous solution of pyridine for 30 min and metallized using the PD1 catalyst as described in Example 20. Treated surfaces exhibited complete blanket metallization over all treated areas.

Example 22

Use of Appropriate Agents to Remove/Displace the Amine Ligand from Treated Surfaces This example demonstrates that the binding of amine containing compounds on surfaces comprised of polysiloxane films containing benzylchloride (i.e., chloromethylphenyl-) or phenyl-functional groups is a reversible process. It also demonstrates that the degree of interaction between the adsorbed/inserting amine ligand and the polymer surface can be controlled by using amine containing compounds with different chemical structures.

CMPTS and Phenyl trichlorosilane films were prepared as detailed in Example 1 and Example 18, respectively. Samples were then treated with either an aqueous solution of 0.1 M DMAB or an aqueous solution of 0.1 M Pyridine at 60° C. for 30 minutes. Aqueous solutions of 0.1M MES (pH~5) (2-morpholinethanesulfonic acid) and 1.0M NaCl were also prepared. The DMAB and pyridine treated films were then immersed in either 0.1 M MES, 1.0 M NaCl, or neat toluene for times ranging from 30 min to 18 hours. Samples were then removed from the solutions, triply rinsed with DI water, dried in a stream of filtered $N_2$ gas, and metallized using the PD1 catalyst as detailed in Example 16. The Ni metallization results are shown in Table VI.

TABLE VI

Metallization Efficiency on Teated Silane Films Following Rinsing

| Silane Film | Treatment (30 min 60° C.) | Rinsing Solution | Ni Metallization Area (%) |
|---|---|---|---|
| CMPTS | DMAB | Toluene, 30 min | 5 |
| CMPTS | DMAB | 1.0 M NaCl, 2.5 hr | 5 |
| CMPTS | DMAB | MES, 18 hrs | 5 |
| CMPTS | Pyridine | Toluene, 30 min | 100 |
| CMPTS | Pyridine | Toluene, 15 hrs | 95 |
| CMPTS | Pyridine | 1.0 M NaCl, 2.5 hr | 100 |

TABLE VI-continued

Metallization Efficiency on Teated Silane Films Following Rinsing

| Silane Film | Treatment (30 min 60° C.) | Rinsing Solution | Ni Metallization Area (%) |
|---|---|---|---|
| CMPTS | Pyridine | MES, 18 hrs | 100 |
| Phenyl | Pyridine | Toluene, 5 hrs | 95 |

Ni metallization entries in Table VI represent the fraction of the catalyzed film area which metallized following immersion in the Ni bath. Rinsing of the DMAB treated surfaces with any of the three rinsing solutions was sufficient to displace or remove a significant amount of the amine ligand from the surface. However, the mechanism by which these rinsing processes release amine ligand from the surfaces has not yet been definitively established. This experiment indicates both that the amine ligand is adsorbed, rather than covalently bound, and that the interaction between the ligand species and the film is easily disrupted. Surfaces which had been treated with pyridine, however, were much more tolerant of the rinsing procedure. CMPTS and Phenyl films treated with pyridine were soaked in toluene for 15 hrs and 5 hours, respectively. This resulted in only a 5% reduction in Ni metallization. Soaking in MES or 1.0 M NaCl solutions did not affect metallization. This indicates that the pyridine ligand interacts much more strongly than the dimethyl amine ligand with these surfaces. Consequently, this experiment demonstrates that it is possible to control the strength of the physisorptive binding event through judicious choice of ligand and surface functional groups.

Example 23

Selective EL Metallization on UV Photopatterned Benzyl Chloride Silane Based Polymers by Treatment with DMAB This example describes a method for fabricating a positive tone metal film on CMPTS polymer surfaces which have been exposed to patterned 193 nm radiation. Treatment of the photopatterned surface with aqueous DMAB solution was used to preferentially adsorb ligands to the unirradiated regions of the CMPTS film. Treatment with catalyst and EL Ni bath resulted in selective metallization of the unirradiated areas of the CMPTS film.

Clean Si wafers and fused silica slides were coated with films of CMPTS as described Example 1. The CMPTS film surface was placed in hard contact with a patterned chrome on fused silica mask and the mask/wafer assembly was placed in a holder aligned with the ArF laser beam for irradiation. A test mask pattern comprising patterns with minimum feature sizes of 2 µm was used and irradiation times were adjusted to compensate for attenuation of the beam (~15%) by the fused silica mask. The CMPTS coated substrates were irradiated through the mask at 193 nm using the ArF excimer laser; the total energy dose delivered to the film surface was 50 mJ/cm$^2$. The mask was removed and the photopatterned substrate was treated 30 min with aqueous DMAB solution as described in Example 16. Following DMAB treatment, the wafer was rinsed 3 times with DI water and dried in a stream of N$_2$ gas. The wafer was then catalyzed with PD1 solution and Ni metallized exactly as described in Example 16. A patterned Ni metal film corresponding to the original pattern design of the mask was observed on the surface of the CMPTS substrate. The metal pattern was consistent with selective binding of the Pd(II) catalyst and subsequent electroless Ni deposition on the masked regions of the CMPTS surface; i.e., a positive tone metal image of the mask pattern was obtained. Ni features as small as 2 microns were observed, indicating that resolution was mask limited in this case. These results conclusively demonstrated that fabrication of patterned positive tone electroless metal films on 193 nm patterned, DMAB treated CMPTS film surfaces could be accomplished at micron resolutions.

Example 24

Selective EL Metallization on UV Photopatterned PVBC Films Using DMAB Treatment

This example describes a method for fabricating a positive tone metal film on PVBC polymer surfaces which have been exposed to patterned 193 nm radiation. Treatment of the photopatterned surface with aqueous DMAB was used to preferentially adsorb ligands to the unirradiated regions of the polymer film. Subsequent treatment with catalyst and EL Ni bath resulted in selective metallization of the unirradiated regions.

Clean Si wafers and fused silica slides were coated with films of PVBC as described in Example 1. The PVBC film surface was placed in hard contact with a patterned chrome on fused silica mask and the mask/wafer assembly was placed in a holder aligned with the ArF laser beam for irradiation. A test mask pattern comprising variable metal line/spaces ranging from 1 µm×1 µm to 80 µm×80 µm was used. The film was then exposed through the mask to 60 mJ/cm$^2$ of radiation from a deep UV contact aligner as described in Example 23. The patterned surface was treated with 0.1 M DMAB solution followed by PD1 catalyst and nickel-boron EL metallization bath, as described in Example 17. The wafer exhibited Ni metal patterns with feature sizes to 1 µm in the unexposed regions of the surface, consistent with a positive tone imaging process.

Example 25

Selective EL Metallization on UV Photopatterned CMPTS Films Using Pyridine Treatment This example describes a method for fabricating a positive tone metal film on CMPTS polymer surfaces which have been exposed to patterned 193 nm radiation. Treatment of the photopatterned surface with aqueous pyridine was used to preferentially adsorb ligands to the unirradiated regions of the CMPTS film. Treatment with catalyst and EL Ni bath resulted in selective metallization of the unirradiated surface regions.

A clean Si wafer was coated with a film of CMPTS as described in Example 1. The CMPTS film surface was then photopatterned using 193 nm radiation and a dose of 50 mJ/cm$^2$ as described in Example 23. The mask was removed and the photopatterned substrate was treated 30 min with aqueous 0.1 M pyridine solution, catalyzed with the PD1 catalyst, and metallized as described in Example 20. A patterned Ni metal film corresponding to the original pattern design of the mask was observed on the surface of the CMPTS substrate. The metal pattern was consistent with selective binding of the Pd(II) catalyst and subsequent electroless Ni deposition on the masked regions of the CMPTS surface; i.e., a positive tone metal image of the mask pattern was obtained. Ni features as small as 2 µm were observed, indicating that resolution was mask limited in this case. These results conclusively demonstrated that fabrication of patterned positive tone electroless metal films on 193 nm patterned, pyridine treated CMPTS film surfaces could be accomplished at micron resolutions.

Example 26

Preferential EL Metallization on X-ray Photopatterned CMPTS Films Using Pyridine Treatment This example describes a method for fabricating a positive tone metal film on CMPTS films which have been exposed to patterned proximity x-rays. Treatment of the photopatterned regions with aqueous pyridine was used to preferentially adsorb ligands to the unirradiated regions of the CMPTS film. Treatment with catalyst and EL Ni bath resulted in preferential metallization of the unirradiated surface regions.

A clean Si wafer was coated with a film of CMPTS as described in Example 1. The CMPTS film surface was then photopatterned using proximity x-rays at 0.9385 nm (800 MeV). Areas measuring 1.2×1.2 cm were irradiated with dosed of 400, 600, 700, 900, and 1100 mJ/cm$^2$ under a gentle stream of nitrogen gas. Samples were subsequently treated with an aqueous 0.1 M pyridine solution at 60° C. for 30 min, treated with the PD1 catalyst and metallized as detailed in Example 16. The Ni metallization results are shown in Table VII.

TABLE VII

Metallization Results for X-ray Exposed CMPTS Treated with Pyridine

| Dose (mJ/cm$^2$) | Ni Metallization (% Area) |
|---|---|
| 400 | 100% |
| 600 | 95% |
| 700 | 10% |
| 900 | 5% |
| 1100 | 5% |

The Ni metallization entries in Table VII represent the fraction of the catalyzed film area which metallizes following immersion in the Ni bath. XPS studies of the films indicate that approximately 80% of the surface chlorine has been removed after a dose of 700 mJ/cm$^2$, the dose at which metallization is significantly hindered. However, trace Ni deposits are noted in the irradiated areas at higher doses, indicating that preferential, rather than completely selective, metal deposition is occurring. The cause of this behavior is as yet unknown. However, x-ray exposures of the films may result in the formation of different photoproducts or photoproduct ratios than corresponding UV irradiations; such photoproducts may exhibit sufficient affinity for the ligand or catalysts to induce metal deposition. Formation of such species may be the result of contamination writing at these higher exposure doses. Although the exact nature of the photoproduct(s) resulting from exposure has not yet been determined, it is nevertheless clear that preferential metal deposition can be accomplished on the surface template using the process described herein.

Example 27

Preferential EL Metallization on X-ray Photopatterned PVBC Films Using DMAB Treatment This example describes a method for fabricating a positive tone metal film on PVBC films which have been exposed to patterned proximity x-rays. Treatment of the photopatterned regions with aqueous pyridine was used to adsorb ligands to the unirradiated regions of the PVBC film. Treatment with catalyst and EL Ni bath resulted in preferential metallization of the unirradiated regions.

A clean Si wafer was coated with a film of PVBC as described in Example 3. The PVBC film surface was then photopatterned using proximity x-rays at 0.9385 nm (800 MeV). PVBC wafers were exposed in 1.2 cm×1.2 cm areas with doses of 50, 100, 200, 300, 500, 700, 900, 1100, and 1500 mJ/cm$^2$ under a gentle stream of nitrogen gas. Samples were then treated with an aqueous 0.1M pyridine solution 60° C. for 30 n in, treated with the PD1 catalyst and metallized as detailed in Example 16. The Ni metallization results are shown in Table VIII.

TABLE VIII

Ni Metallization Results for Proximity X-ray Exposed PVBC Treated with Pyridine

| Dose (mJ/cm$^2$) | Ni Metallization (% Area) |
|---|---|
| 50 | 100 |
| 100 | 100 |
| 200 | 100 |
| 300 | 100 |
| 500 | 100 |
| 700 | 50 |
| 900 | 5 |
| 1100 | 5 |
| 1500 | 5 |

The Ni metallization entries in Table VII represent the fraction of the catalyzed film area which metallizes following immersion in the Ni bath. Chlorine loss during exposure to proximity x-ray is significantly slower on PVBC than for films of CMPTS, with approximately a 30% decrease in surface Cl at doses of 1500 mJ/cm$^2$. Once again, however, trace Ni deposits are noted in the irradiated areas at higher doses. Such behavior is indicative of preferential, rather than completely selective, metal deposition. As explained in Example 26, a potential cause for this phenomenon may include the formation of different photoproducts or photoproduct under x-ray exposure than UV irradiation; such photoproducts may exhibit sufficient affinity for the ligand or catalysts to induce metal deposition. Formation of such species may be the result of contamination writing at these higher exposure doses. Although the exact nature photoproduct(s) resulting from exposure has not yet been determined, it is nevertheless clear that preferential metal deposition can be accomplished on the surface template using the process described herein.

Example 28

Incorporation and Polymerization of Pyrrole in CMPTS Films

This example describes a method by which a polymerized layer of pyrrole can be fabricated on siloxane films. Treatment of phenyltrichlorosilane films with aqueous pyrrole was used to adsorb pyrrole monomer to the siloxane film. Treatment of the adsorbed pyrrole monomer with an Fe(III) solution resulted in polymerization of the adsorbed pyrrole.

Clean silica slides were coated with either a film of CMPTS as described in Example 1. The purity of the bulk pyrrole (98% purity, Aldrich Co.) was confirmed by obtaining a UV-VIS spectra of a 7.5×10$^{-5}$ M solution of pyrrole in DI H$_2$O. A single peak at approximately 193 nm was observed as expected and the pyrrole was used without further purification.

Silica slides coated with CMPTS and acid cleaned slides without a siloxane coating were immersed in a 0.1% aqueous solution of pyrrole maintained at 50° C. Following a 3 hr treatment the slides were removed from the solutions, rinsed with DI water and blown dry with filtered N2. The slide without a siloxane film exhibited no significant adsorption in the 190–800 nm range, indicating minimal nonspecific adsorption of pyrrole to surface silanol sites. The treated CMPTS film, however, exhibited a marked increase in adsorption at the 195 nm peak. The integral of the absorbance from 193–215 nm was found to increase from 0.41 to 0.71, indicating significant incorporation of pyrrole into the CMPTS film.

Pyrrole treated CMPTS films and acid cleaned slides without a siloxane coating were treated with an Fe(III) solution at room temperature for 30 minutes. The solution was prepared by dissolving 3.5 g $FeCl_3.6H_2O$, 0.98 g anthraquinone-2-sulfonic acid sodium salt monohydrate, and 5.34 g 5-sulfosalicylic acid dihydrate in 100 ml of DI $H_2O$. (Reference: T. G. Vargo et al., "Patterned Polymer Multilayer Fabrication by Controlled Adhesion of Polyelectrolytes to Plasma Modified Fluoropolymer Surfaces", Supramolecular Science, Volume 2, No. 3–4, 17 (1995). Following treatment the samples were triply rinsed with DI water and blown dry with filtered nitrogen. The UV spectra of the acid cleaned slide following treatment with the Fe(III) solution showed no significant absorption in the 190–800 nm range. The CMPTS/pyrrole treated film, however, exhibited a significant absorption in the 190–800 nm range indicating successful polymerization of the pyrrole trapped within the siloxane host film.

Example 29

Stability of the Physisorbed Pyridine Ligand in CMPTS Organosiloxane Films Under High Vacuum Conditions This example illustrates the stability of pyridine ligand physisorbed into a CMPTS thin film under high vacuum conditions such as those required for surface patterning using conventional electron beams or a scanning tunneling microscope (STM) tip.

A clean Si wafer was coated with a film of CMPTS as described in Example 1. The sample was then immersed in 0.05 M pyridine (aq) solution for 3 h at 25±1° C. The treated sample was rinsed 4 times with deionized water, dried in a filtered stream of $N_2$ gas (from liquid $N_2$ boiloff), and stored in a Fluoroware® wafer container overnight. The sample was transferred to the load chamber of a JEOL 5DII 50 keV Electron Beam Nanowriter and the chamber was evacuated to a pressure of $10^{-7}$ atm over the course of 30 min. The sample was transferred into the writing chamber and held under vacuum for 1 h before being removed from the instrument and stored again overnight in the Fluoroware® wafer container. The sample was then treated with freshly prepared PD1 EL catalyst for 30 min. Excess catalyst dispersion was removed using a Pasteur pipet, the sample was gently rinsed 3 times with deionized water, and immersed in a 10% NIPOSIT® 468 EL Ni bath for 20 min at 25±1° C. The sample was rinsed 3 times with deionized water, dried in the filtered $N_2$ gas stream, and examined by eye for the presence of deposited Ni, if any. Additional samples that had been placed in the writing chamber under vacuum for 2 h and 3 h were identically processed. In all cases, a mirror-like, homogeneous EL Ni metal film was deposited over the entire area of the sample contacted with the PD1 catalyst. These results confirm the stability of the pyridine in the CMPTS film towards evaporative loss and lack of blockage of the pyridyl ligand N site (due to settling of pump oil residues on the substrate) under high vacuum conditions.

Example 30

Direct Patterning and Preferential EL Metallization of CMPTS Films Containing Physisorbed Pyridine Using a High Voltage Electron Beam Exposure Tool This example shows that CMPTS films containing pyridine ligand can be used directly as substrates in a lithographic process for the fabrication of patterned metal features.

A clean Si wafer was coated with a film of CMPTS as described in Example 1. The sample was then immersed in 0.05 M pyridine (aq) solution for 3 h at 25±1° C. The treated sample was rinsed 4 times with deionized water, dried in a filtered stream of $N_2$ gas (from liquid $N_2$ boiloff), and stored in a Fluoroware® wafer container overnight. The sample was transferred to the load chamber of a JEOL 5DII 50 keV Electron Beam Nanowriter and the chamber was evacuated to a pressure of $10^{-7}$ atm over the course of 30 min. The sample was transferred into the writing chamber and a series of patterns were written on the sample at various known locations and doses. The patterns used included a serpentine block pattern of overall size 50 $\mu$m×50 $\mu$m and serpentine linewidth ~0.5 $\mu$m bordered by a series of ten ~20 $\mu$m×20 $\mu$m square arrays, each containing a square grid of uniformly sized ~1 $\mu$m×1 $\mu$m square holes spaced 1 $\mu$m apart. The patterns was written using doses of 500 $C/cm^2$, 1000 $C/cm^2$, 5000 $C/cm^2$, and 10000 $C/cm^2$ during the course of 3 h. Samples were then removed from the instrument and stored again overnight in the Fluoroware® wafer container. The sample was next treated with PD1 catalyst for ~30 mins, rinsed three times with deionized water, and immersed in room temperature 10% NIPOSIT® 468 EL Ni bath for ~15 mins. Following an aqueous rinse and drying in a filtered stream of $N_2$ gas, the sample was examined under the optical microscopy for evidence of patterned metal deposition. Although no patterns were observed for the area exposed at a dose of 500 $C/cm^2$, a faint, overmetallized pattern was noted at the area exposed at 1000 $C/cm^2$. Clear patterns were observed under the optical microscope (400×magnification) for all pattern features exposed at 5000 $C/cm^2$. The area exposed at a dose of 10000 $C/cm^2$ also exhibited patterned metallization corresponding to the written pattern; however, some narrowing of the serpentine lines and broadening of the holes suggested that slight overexposure had occurred at this dose.

This example shows that pyridine physisorbed into a CMPTS film can be rendered incapable of supporting electroless metal deposition following exposure to a high-energy electron beam. Note that the slow (i.e., ~3 h pyridine solution treatment) pyridine physisorption step is performed prior to, rather than following, electron beam patterning. Formation of metal patterns in this manner is therefore compatible with process time restrictions associated with commercial manufacture because the slower CMPTS chemisorption and pyridine physisorption steps are decoupled from the faster patterning and metal deposition processes. That is, CMPTS chemisorption and pyridine physisorption can be leisurely completed via bulk treatments with the finished substrate later supplied as the raw material for the faster, serial patterning process.

Example 31
Preferential EL Metallization on STM Patterned CMPTS Films Using a Pyridine Post-exposure Physisorption Treatment This example shows that electrons from an STM tip can be used to modify the surface of a CMPTS film to control subsequent physisorption of pyridine ligand such that selective EL metallization of the patterned film is promoted.

A clean Si wafer was coated with a film of CMPTS as described in Example 1. The sample was loaded into a scanning tunneling microscope (STM) purchased from W.A. Technology, Inc., which had been modified as described in the literature (D. P. DiLella, J. H. Wandass, R. J. Colton, and C. R. K. Marrian, *Rev. Sci. Instrum.*, 60, 997 (1989)). A vacuum was applied to the chamber until an operating pressure of ~$5 \times 10^{-8}$ atm was reached. An electric potential of −4 V relative to the sample was applied to the STM tip and the operating current was set at 300 pA. The tip was moved laterally across the substrate surface at a rate of ~0.1 m/s to expose a ~3 $\mu$m×5 $\mu$m rectangular region. The sample was removed from the STM and treated with a ~0.10 M pyridine (aq) solution at ~50° C. for 3 h. Following a triple rinse with deionized water and drying in a stream of filtered $N_2$ gas, the sample was treated with PD1 catalyst for ~30 mins, rinsed three times with deionized water, and immersed in room temperature 10% NIPOSIT® 468 EL Ni bath for ~5 mins. After an aqueous rinse and drying in a filtered stream of $N_2$ gas, the sample was examined under the optical microscopy for evidence of patterned metal deposition. An otherwise homogeneous EL Ni metal film containing an unmetallized region corresponding to the rectangular exposure pattern was clearly observed. This behavior is consistent with modification of the CMPTS film by the STM tip to an extent such that the level (if any) of pyridine subsequently physisorbed into the exposed film region is no longer sufficient to support metal deposition under our experimental conditions.

Obviously, many modifications and variations of the present invention are possible in light of the above teachings. It is therefore to be understood that, within the scope of the appended claims, the invention may be practiced otherwise than as specifically described.

What is claimed is:

1. A process for modifying a substrate, comprising the steps:
   (a) providing on said substrate functional groups adapted for conversion to oxygen-containing photoproducts upon exposure to actinic radiation;
   (b) exposing at least a portion of said substrate to said actinic radiation, thereby converting said functional groups in an exposed region of said substrate to said photoproducts;
   (c) contacting said photoproducts with a primary or secondary amine in the presence of hydrogen ions, thereby forming imine groups; and
   (d) contacting said imine groups with a reducing agent, thereby forming amine groups on said substrate in said exposed region.

2. The process of claim 1, wherein said conversion is a direct conversion from said functional groups to said photoproducts.

3. The process of claim 1, wherein said conversion is an indirect conversion from said functional groups to one or more intermediate products to said photoproducts.

4. The process of claim 1, wherein said actinic radiation is selected from the group consisting of ultraviolet radiation, electrons, ions, and x-ray radiation.

5. The process of claim 1, wherein said photoproducts are selected from the group consisting of aldehydes, ketones, alcohols, and acids.

6. The process of claim 1, wherein said functional groups adapted for conversion to photoproducts are selected from the group consisting of organic halides and organic pseudohalides.

7. The process of claim 1, wherein said functional groups adapted for conversion to photoproducts have the general formula —Ar—$(CH_2X)_n$, wherein Ar is an aryl group, X is selected from the group consisting of chloride, bromide, fluoride, acetate (OAc), trifluoromethanesulfonate (OTf), methanesulfonate, toluenesulfonate, sulfonate, tosylate, azide, cyanide, isocyanide, thiocyanate, isothiocyanate, and thiosulfate, and n is an integer between 1 and 5, inclusive.

8. The process of claim 1, wherein said functional groups adapted for conversion to photoproducts are groups in a polymer film.

9. The process of claim 8, wherein said groups in said polymer film are polymer backbone groups.

10. The process of claim 8, wherein said groups in said polymer film are polymer pendant groups.

11. The process of claim 8, wherein said polymer film is a coating on said substrate.

12. The process of claim 8, wherein said polymer film is a component in a mixture of polymers forming a coating on said substrate.

13. The process of claim 8, wherein said polymer film comprises a polyvinyl benzyl halide or polyvinyl benzyl pseudohalide.

14. The process of claim 1, wherein said amine groups have the general formula —$NRR^2$, wherein said R is a moiety to impart a selected property to said substrate, and said $R^2$ is hydrogen or an independently selected moiety to impart a selected property to said substrate, wherein said R is selected from the group consisting of antibodies, haptens, nucleic acid strands, polypeptides, proteins, chromophores, fluorophores, ligands, and hydrogen.

15. The process of claim 14, wherein R and $R^2$ are hydrogen, and wherein said amine in step (c) of claim 1 is $NH_4OAc$.

16. The process of claim 1, wherein said amine groups are polyamidoamine dendrimers.

17. The process of claim 1, wherein said reducing agent is a selective reducing agent for said imine bond.

18. The process of claim 1, wherein said reducing agent is a reducing agent to reduce said imine groups to said amine groups.

19. The process of claim 1, wherein said reducing agent is $NaBH_3CN$.

20. The process of claim 1, wherein said photoproducts are selected from the group consisting of aldehydes and acids, and further comprising:
   (e) depositing metal on said amine groups by a method selected from the group consisting of:
      (i) contacting said amine groups with a metallization catalyst and subsequently with an electroless plating solution, thereby forming a metal coating on said exposed region; and
      (ii) depositing said metal on said amine groups by chemical vapor deposition.

21. The process of claim 20, wherein said electroless plating solution is a plating solution for the deposition of metal wherein said metal in said electroless plating solution is selected from the group consisting of nickel, gold, copper, silver, platinum, palladium, cobalt, iron, zinc, rhenium and combinations thereof.

22. The process of claim 21, wherein said steps (c) and (d) are performed concurrently.

23. The process of claim 21, wherein said step (c) is performed prior to step (d).

24. A process for metallizing a substrate, comprising the steps:
   (a) providing on said substrate functional groups adapted for conversion to photoproducts selected from the group consisting of aldehydes and acids upon exposure to actinic radiation;
   (b) exposing at least a portion of said substrate to said actinic radiation, thereby converting said functional groups in an exposed region of said substrate to said photoproducts;
   (c) contacting said photoproducts with a primary or secondary amine in the presence of hydrogen ions, thereby forming imine groups;
   (d) contacting said imine groups with a reducing agent, thereby forming amine groups on said substrate in said exposed region; and
   (e) depositing a metal on said amine groups by chemical vapor deposition.

25. A process for modifying a substrate, comprising the steps:
   (a) providing on said substrate aryl functional groups adapted for conversion to oxygen-containing photo-products upon exposure to actinic radiation;
   (b) exposing a portion of said substrate to said actinic radiation, thereby converting said aryl functional groups in an exposed region of said substrate to said photoproducts, and not converting said aryl functional groups in an unexposed region of said substrate to said photoproducts;
   (c) contacting said aryl functional groups in said unexposed region of said substrate with a compound adapted for physisorption to said aryl functional groups, thereby physisorbing said compound onto said substrate in said unexposed regions.

26. The process of claim 25, wherein said compound adapted for physisorption to said aryl functional groups is aliphatic.

27. The process of claim 25 wherein said compound adapted for physisorption to said aryl functional groups is a borane complex of an aliphatic or aromatic amine.

28. The process of claim 25 wherein said compound adapted for physisorption to said aryl functional groups is selected from the group consisting of dimethylamineborane, borane-4-methylmorpholine complex, borane-piperidine complex, 4-(borane-dimethylamino pyridine), borane trimethylamine complex, borane pyridine complex, pyridine, 4,4'-bipyridine, and 2,2'-bipyridine.

29. The process of claim 25, wherein said actinic radiation is selected from the group consisting of ultraviolet radiation, high voltage electrons, tunneling voltage electrons, ions, and x-ray radiation, wherein high voltage electrons are electron beams accelerated by a potential difference of $\geq 5KY$.

30. The process of claim 25, wherein said compound adapted for physisorption to said aryl functional groups has a general formula selected from the group consisting of $Ar^1$—$R^1$ and $R^3$—$R^1$, wherein said $Ar^1$ is an aryl moiety, said $R^3$ is an aliphatic moiety, and said $R^1$ is an —N containing group.

31. The process of claim 30, wherein said $R^1$ binds a metallization catalyst.

32. The process of claim 25, wherein said step of contacting said aryl functional groups in said unexposed region of said substrate with said compound adapted for physisorption to said aryl functional groups is performed in a polar solution.

33. The process of claim 32, wherein said polar solution is selected from the group consisting of aqueous solutions and alcoholic solutions.

34. The process of claim 25, wherein said compound adapted for physisorption to said aryl functional groups has the general formula $Ar^2$, wherein said $Ar^2$ is an aryl moiety and further imparts a selected property to said substrate.

35. The process of claim 34, wherein said $Ar^2$ binds a metallization catalyst.

36. The process of claim 34, wherein said $Ar^2$ is pyridine absorbates having a solubility $\geq 1$ mmole/liter.

37. The process of claim 34, wherein said physisorption of said $Ar^2$ is stable under a vacuum of $10^{-6}$ torr or lower.

38. The process of claim 25, wherein said exposing step is conducted prior to said physisorbing step.

39. The process of claim 25, wherein said exposing step is conducted after said physisorbing step.

40. The process of claim 25, wherein said functional groups adapted for conversion to photo-products are bound to said substrate through siloxane linkages, and have the general formula —Ar—$(CH_2X)_n$, wherein Ar is an aryl group, X is selected from the group consisting of chloride, bromide, fluoride, acetate (OAc), trifluoromethanesulfonate (OTf), methanesulfonate, toluenesulfonate, sulfonate, tosylate, azide, cyanide, isocyanide, thiocyanate, isothiocyanate, and thiosulfate, and n is an integer between 1 and 5, inclusive.

41. The process of claim 40, wherein n=1.

42. The process of claim 25, wherein said functional groups adapted for conversion to photo-products are groups in a polymer film, and have the general formula —Ar—$(CH_2X)_n$, wherein Ar is an aryl group, X is selected from the group consisting of chloride, bromide, fluoride, acetate (OAc), trifluoromethanesulfonate (OTf), methanesulfonate, toluenesulfonate, sulfonate, tosylate, azide, cyanide, isocyanide, thiocyanate, isothiocyanate, and thiosulfate, and n is an integer between 1 and 5, inclusive.

43. The process of claim 42, wherein said wherein said groups in said polymer film are polymer backbone groups, and n is an integer between 1 and 4, inclusive.

44. The process of claim 42, wherein said wherein said groups in said polymer film are polymer pendant groups.

45. The process of claim 25, wherein said actinic radiation cleaves Si—C bonds in said exposed region, thereby producing Si—OH groups on said substrate.

46. A process for modifying a substrate, comprising the steps:
   (a) providing on said substrate functional groups selected for physisorbing pyrrole;
   (b) contacting said functional groups with pyrrole, thereby physisorbing said pyrrole onto said substrate;
   (c) contacting said physisorbed pyrrole with an oxidant solution for initiating polymerization in said pyrrole, thereby polymerizing said pyrrole.

47. The process of claim 46, wherein said oxidant solution is an Fe(III) solution.

48. The process of claim 46, wherein said oxidant solution further comprises at least one dopant selected from the group consisting of anthraquinone-2-sulfonic acid sodium salt monohydrate and 5-sulfosalicylic acid dihydrate.

* * * * *

UNITED STATES PATENT AND TRADEMARK OFFICE
CERTIFICATE OF CORRECTION

PATENT NO. : 6,436,615 B1
DATED : August 20, 2002
INVENTOR(S) : Susan L. Brandow et al.

It is certified that error appears in the above-identified patent and that said Letters Patent is hereby corrected as shown below:

<u>Title page,</u>
Item [75], Inventors' name, delete "M." after "Walter" and before "Dressick", add -- J. -- after "Walter" and before "Dressick".

Item [56], References Cited, OTHER PUBLICATIONS, delete "accepted to be publ. in" after "Feb. 28-Mar. 2, 2001," and before "Proc. of SPIE, vol. 4343," in the sixth publication cited; delete "due out Fall" after "Proc. of SPIE, vol. 4343," and before "2001";
Add -- pp. 294-305, -- after "due out Fall" and before "2001".

<u>Column 2,</u>
Lines 38-41, BRIEF DESCRIPTION OF THE DRAWINGS, replace "CMPTS" with -- chloromethylphenyltrichlorosiloxane (CMPTS) -- and replace "PVCB" with -- polyvinylbenzyl chloride (PVBC) --.

<u>Column 5,</u>
Lines 12-17, replace "CMP" with -- chloromethylphenyl (CMP) --.

<u>Column 26,</u>
Lines 46-49, replace "PDT" with -- PD1 --.

<u>Column 35,</u>
Line 7, replace "N2" with -- $N_2$ --.

<u>Column 36,</u>
Lines 34-54, replace any units listed as "$C/cm^2$" with -- $\mu C/cm^2$ --.

UNITED STATES PATENT AND TRADEMARK OFFICE
CERTIFICATE OF CORRECTION

PATENT NO.    : 6,436,615 B1
DATED         : August 20, 2002
INVENTOR(S)   : Susan L. Brandow et al.

It is certified that error appears in the above-identified patent and that said Letters Patent is hereby corrected as shown below:

<u>Column 37,</u>
Lines 21-23, replace "~0.1 m/s" with -- ~0.1 $\mu$m/s --.

<u>Column 39,</u>
Line 59, replace "$\geq$5KY" with -- $\geq$5kV --.

Signed and Sealed this

First Day of July, 2003

JAMES E. ROGAN
*Director of the United States Patent and Trademark Office*